(12) United States Patent
Lefevre

(10) Patent No.: US 10,091,046 B1
(45) Date of Patent: Oct. 2, 2018

(54) JOINT USE OF PROBABILISTIC SIGNAL SHAPING AND FORWARD ERROR CORRECTION

(71) Applicant: Nokia Technologies Oy, Espoo (FI)

(72) Inventor: Yannick Lefevre, Kessel-Lo (BE)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/817,516

(22) Filed: Nov. 20, 2017

(51) Int. Cl.
*H04L 27/36* (2006.01)
*H04L 1/00* (2006.01)
*H03M 13/11* (2006.01)

(52) U.S. Cl.
CPC ......... *H04L 27/36* (2013.01); *H03M 13/1102* (2013.01); *H04L 1/0041* (2013.01); *H04L 1/0058* (2013.01)

(58) Field of Classification Search
CPC ... H04L 1/0041; H04L 1/0058; H04L 1/0059; H04L 1/0057; H04L 1/0065; H04L 27/36; H04L 1/0061
USPC .......................... 375/260–261, 265, 295, 315
See application file for complete search history.

(56) References Cited

U.S. PATENT DOCUMENTS

| | | | |
|---|---|---|---|
| 7,778,341 B2 * | 8/2010 | Tong | H03M 13/258 375/265 |
| 9,407,398 B2 | 8/2016 | Batshon et al. | |
| 9,673,907 B1 | 6/2017 | Vassilieva et al. | |
| 9,929,813 B1 * | 3/2018 | Batshon | H04B 10/516 |
| 2009/0103646 A1 * | 4/2009 | Dowling | H03M 13/31 375/265 |
| 2009/0180495 A1 | 7/2009 | Li et al. | |

(Continued)

FOREIGN PATENT DOCUMENTS

| | | |
|---|---|---|
| WO | WO2010005470 A1 | 1/2010 |
| WO | WO2010019168 A1 | 2/2010 |

OTHER PUBLICATIONS

Stojković, N. "ADSL analog front end." AUTOMATIKA: časopis za automatiku, mjerenje, elektroniku, računarstvo i komunikacije 47.1-2 (2006): 59-67.

(Continued)

*Primary Examiner* — Emmanuel Bayard
(74) *Attorney, Agent, or Firm* — Mendelsohn Dunleavy, P.C.; Yuri Gruzdkov

(57) ABSTRACT

A communication system in which probabilistic signal shaping and FEC coding are jointly used in an efficient manner that enables, e.g., the use of relatively high modulation orders without a penalizing increase of the FEC-code rate. In an example embodiment, the amplitudes of transmitted constellation symbols are generated using a shaping encoder. Some transmitted constellation symbols carry, as sign bits, the parity-bit values generated by an FEC encoder configured to operate on (i) a subset of bits from the binary labels of the shaped amplitudes and (ii) an additional set of unshaped information bits. Some other transmitted constellation symbols carry, as sign bits, the bit values of the additional set of unshaped information bits. In some embodiments the used FEC code can be a low-density parity-check code. Some embodiments can be used in communication systems relying on discrete multi-tone modulation, such as the systems providing DSL access over subscriber lines.

24 Claims, 12 Drawing Sheets

(56) References Cited

U.S. PATENT DOCUMENTS

2018/0026725 A1* 1/2018 Cho .................. H04L 1/0041
2018/0083716 A1* 3/2018 Cho .................. H04B 7/0456

OTHER PUBLICATIONS

Jones, E. "Introduction to DSL." Fundamentals of DSL technology (2006): 119.
Forney, G. D. "Trellis shaping." IEEE Transactions on Information Theory 38.2 (1992): 281-300.
Eleftheriou, Evangelos, and S. Olcer. "Low-density parity-check codes for digital subscriber lines." Communications, 2002. ICC 2002. IEEE International Conference on. vol. 3. IEEE, 2002.
Wei, D., "G.fast: Performance of LDPC Coded Modulation," Study Group 15, ITU—Telecommunication Standardization Sector, Temporary Document 2017-02-Q4-034, Feb. 2017, 6 pages.
Böcherer, G., et al. "Bandwidth efficient and rate-matched low-density parity-check coded modulation." IEEE Transactions on Communications 63.12 (2015): 4651-4665.
Camps, C., et al., "Evaluation of G.hn: Agreement to Support the Generic Multi Level Coding Scheme," Study Group 15, ITU—Telecommunication Standardization Sector, Temporary Document 2017-01-Q18-023, Jan. 2017, pp. 1-8.
Fehenberger, Tobias, et al. "LDPC coded modulation with probabilistic shaping for optical fiber systems." Optical Fiber Communication Conference. Optical Society of America, 2015, 3 pages.
Steiner, Fabian, and Patrick Schulte. "Design of robust, protograph based LDPC codes for Rate-Adaptation via probabilistic shaping." Turbo Codes and Iterative Information Processing (ISTC), 2016 9th International Symposium on. IEEE, 2016, pp. 5 pages.
Idler, W., et al. "Field Trial of a 1 Tb/s Super-Channel Network Using Probabilistically Shaped Constellations." Journal of Lightwave Technology 35.8 (2017): 1399-1406.
Cho, J., et al. "Trans-Atlantic field trial using probabilistically shaped 64-QAM at high spectral efficiencies and single-carrier real-time 250-Gb/s 16-QAM." Optical Fiber Communication Conference. Optical Society of America, 2017, 3 pages.
Böcherer, G., et al. "High Throughput Probabilistic Shaping with Product Distribution Matching." arXiv preprint arXiv:1702.07510 (2017), pp. 1-9.
Wei, D., "G.mgfast: Constellation Shaping on LDPC Coded Modulation," Study Group 15, International Telecommunication Union, Telecommunication Standardization Sector, Sep. 2017, pp. 1-6.

* cited by examiner

200

300

430

420

410

500

550

700 m = 3
c = 2

800

900

1100

1200

1300

1400

JOINT USE OF PROBABILISTIC SIGNAL SHAPING AND FORWARD ERROR CORRECTION

BACKGROUND

Field

The present disclosure relates to communication equipment and, more specifically but not exclusively, to methods and apparatus for transmitting and receiving communication signals using probabilistic signal shaping and forward error correction (FEC).

Description of the Related Art

This section introduces aspects that may help facilitate a better understanding of the disclosure. Accordingly, the statements of this section are to be read in this light and are not to be understood as admissions about what is in the prior art or what is not in the prior art.

Signal shaping can provide energy savings, transmission-distance increases, and/or bit-error-rate reductions often referred to as the shaping gain. In a typical implementation of signal shaping, constellation symbols of relatively large energy are transmitted less frequently than constellation symbols of relatively small energy. For a linear communication channel, the shaping gain can theoretically approach 1.53 dB.

At least some communication systems can benefit from joint use of signal shaping and forward error correction.

SUMMARY OF SOME SPECIFIC EMBODIMENTS

Disclosed herein are various embodiments of a communication system in which probabilistic signal shaping and FEC coding are jointly used in an efficient manner that enables, e.g., the use of relatively high modulation orders without a penalizing increase of the FEC-code rate. In an example embodiment, the amplitudes of transmitted constellation symbols are generated using a shaping encoder. Some transmitted constellation symbols carry, as sign bits, the parity-bit values generated by an FEC encoder configured to operate on (i) a subset of bits from the binary labels of the shaped amplitudes and (ii) an additional set of unshaped information bits. Some other transmitted constellation symbols carry, as sign bits, the bit values of the additional set of unshaped information bits. In some embodiments the used FEC code can be a low-density parity-check code. Some embodiments can be used in communication systems relying on discrete multi-tone modulation, such as the systems providing digital-subscriber-line (DSL) or G.fast access over copper wiring. Some embodiments are compatible with layered FEC coding, e.g., employing an outer FEC code and an inner FEC code. Some embodiments are compatible with simultaneous use of multiple shaping codes.

According to one embodiment, provided is an apparatus comprising a data transmitter that comprises an electrical analog front end and a digital signal processor, the digital signal processor being configured to: redundancy-encode an input data stream to generate a first constellation-symbol stream; and drive the analog front end to cause a modulated electrical carrier generated by the analog front end to carry the first constellation-symbol stream; and wherein the digital signal processor comprises: a shaping encoder configured to generate a bit-word stream by encoding the input data stream using a shaping code; an FEC encoder configured to generate a parity data stream by encoding a subset of bits of the bit-word stream using an FEC code; and a constellation mapper configured to: use the bit-word stream to select constellation-symbol amplitudes for the first constellation-symbol stream; and use the parity data stream to select signs applied to at least some of the constellation-symbol amplitudes.

According to another embodiment, provided is an apparatus comprising a data receiver that comprises an electrical analog front end and a digital signal processor, the digital signal processor being configured to process a first stream of values representing a modulated carrier of a received electrical signal outputted by the electrical analogue front end, the first stream of values representing a first constellation-symbol stream, the digital signal processor being configured to redundancy-decode the first stream of values to recover a source data stream redundancy-encoded in the first constellation-symbol stream and carried by the modulated electrical carrier; and wherein the digital signal processor comprises: an FEC decoder configured to generate a first bit stream and a first bit-word stream by redundancy-decoding the first stream of values, the first bit stream carrying sign bits of the first constellation-symbol stream, the first bit-word stream carrying a first subset of bits of binary values encoded in constellation-symbol amplitudes of the first constellation-symbol stream, the redundancy-decoding being performed using an FEC code; a constellation demapper configured to generate a second bit-word stream by matching each of the first stream of values with a corresponding constellation point, the matching being performed using the first bit stream and the first bit-word stream, the second bit-word stream carrying a second subset of bits of the binary values encoded in the constellation-symbol amplitudes of the first constellation-symbol stream; and a shaping decoder configured to recover the source data stream by decoding a third bit-word stream generated by combining bit-words of the first and second bit-word streams, the decoding being performed using a shaping code.

BRIEF DESCRIPTION OF THE DRAWINGS

Other aspects, features, and benefits of various disclosed embodiments will become more fully apparent, by way of example, from the following detailed description and the accompanying drawings, in which.

DETAILED DESCRIPTION

Figure 1:
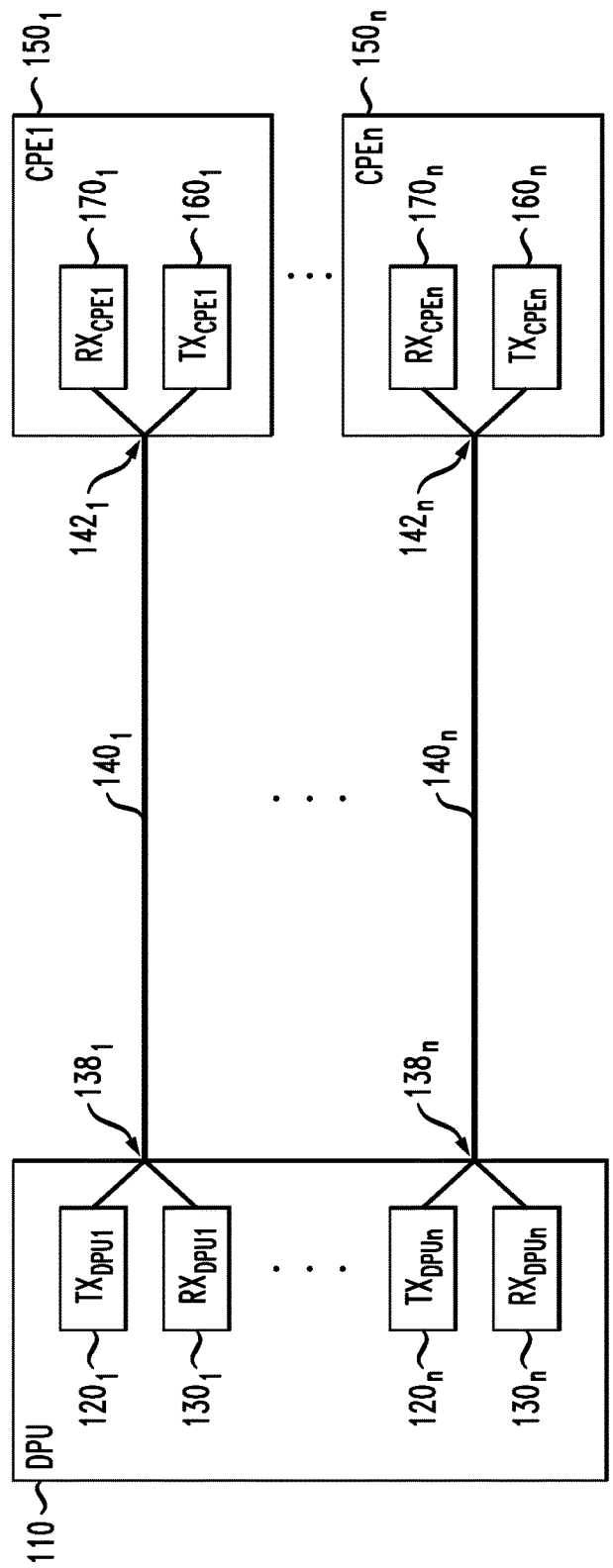
FIG. 1 shows a block diagram of a DMT system in which various embodiments can be practiced.

Some embodiments disclosed herein may benefit from the use of at least some features disclosed in U.S. patent application Ser. No. 15/817,537 by Yannick Lefevre, et al., filed on the same day as the present application and entitled "MULTI-CODE PROBABILISTIC SIGNAL SHAPING USING FREQUENCY-DIVISION MULTIPLEXING," which is incorporated herein by reference in its entirety.

The following acronyms/abbreviations are used in the description of various embodiments and/or in the accompanying drawings:

ADC Analog-to-Digital Converter;
AFE Analog Front End;
AWGN Additive White Gaussian Noise;
CPE Customer Premise Equipment;
CRC Cyclic Redundancy Check;
DAC Digital-to-Analog Converter;
DMT Discrete Multi-Tone;
DMUX Demultiplexer;
DPU Distribution Point Unit;
DSP Digital Signal Processor;
DSL Digital Subscriber Line;
DTU Data Transfer Unit;
FDM Frequency-Division Multiplexing;
FEC Forward Error Correction;
FFT Fast Fourier Transform;
FIFO Fixed-In/Fixed-Out;
FIVO Fixed-In/Variable-Out;
IFFT Inverse Fast Fourier Transform;
IQ In-phase/Quadrature;
I/O Input/Output;
LAN Local Area Network;
LDPC Low Density Parity Check;
LLR Log-Likelihood Ratio;
LSB Least-Significant Bit;
MSB Most-Significant Bit;
MUX Multiplexer;
OFDM Orthogonal Frequency-Division Multiplexing;
PAM Pulse Amplitude Modulation;
POTS Plain Old Telephone Service;
QAM Quadrature Amplitude Modulation;
RF Radio Frequency;
RS Reed Solomon;
SNR Signal-to-Noise Ratio;
VIFO Variable-In/Fixed-Out; and
VIVO Variable-In/Variable-Out.

Frequency-division multiplexing (FDM) is a method of transmitting data on multiple carrier frequencies that can be used in wireline, wireless, and optical communication channels. Different variants of FDM are used in various forms of wideband digital communications, digital television, audio broadcasting, digital subscriber line (DSL) or G.fast Internet access, local area networks (LANs), home networks, 4G mobile-access networks, etc. Some variants of FDM, typically collectively referred to as discrete multi-tone (DMT) modulation, are used in wireline communications channels established over, e.g., plain old telephone service (POTS) copper wiring, coaxial cable, and/or power lines. Some FDM schemes use orthogonal frequency-division multiplexing (OFDM).

Some FDM (e.g., DSL and/or G.fast) systems can benefit from joint use of signal shaping and FEC coding.

There are two general types of signal shaping that are referred to as geometric and probabilistic, respectively. Geometric shaping can be implemented to optimize the location of constellation points (symbols) on the complex plane for a fixed (but not necessarily uniform) symbol probability. Probabilistic shaping can be implemented to optimize the probability of constellation symbols that are located on a fixed (but not necessarily uniform) grid on the complex plane. Although both types of signal shaping can theoretically be implemented to achieve the shaping gain of up to 1.53 dB for an additive-white-Gaussian-noise (AWGN) channel, probabilistic shaping offers several important advantages over geometric shaping. These advantages include but are not limited to compatibility with conventional (e.g., available off-the-shelf) constellations and FEC codes.

A representative systematic FEC code is used to convert an input bit sequence into an expanded bit sequence (FEC codeword) by appending to the input bit sequence a corresponding set of parity bits. Some well-performing FEC codes are low-density parity-check (LDPC) codes. LDPC codes are linear block codes that have parity check matrices with a relatively small number of nonzero elements in each row and column. An LDPC decoder may use soft information during decoding, which information can be generated by a soft information detector, e.g., relying on a soft-output algorithm, such as the Viterbi algorithm or the Bahl-Cocke-Jelinek-Raviv algorithm.

LDPC coding is known in the error-correction arts and is briefly reviewed, e.g., in International Patent Application Publication No. WO 2010/019168, which is incorporated herein by reference in its entirety. Some aspects of LDPC coding specific to DSL systems are briefly reviewed, e.g., in the article by E. Eleftheriou and S. Olcer, "Low-Density Parity-Check Codes for Digital Subscriber Lines," which is also incorporated herein by reference in its entirety.

When a systematic FEC (e.g., LDPC) encoder is used to encode the output of a shaping encoder (also sometimes referred to as a distribution matcher), each of the resulting FEC codewords contains a "shaped" set of information bits and the corresponding "unshaped" set of parity bits. The shaping encoder causes the shaped set of information bits to contain bit-words the values of which have a non-uniform rate of occurrence and form a distribution histogram in accordance with the operative shaping code. In contrast, the FEC encoder typically causes the statistical properties of the unshaped set (e.g., block) of parity bits to be similar to those of a random or pseudo-random data sequence. When parsed into bit-words, the unshaped set of parity bits typically contains bit-words the values of which have a substantially uniform (e.g., constant) rate of occurrence. If both (shaped and unshaped) sets of the bit-words are transmitted over the communication channel without any additional processing, then the transmission of unshaped parity bits may significantly and adversely affect the overall effective shaping gain realized in the corresponding communication system.

Some of the above-indicated problems can be addressed by employing a shaping encoder to generate amplitudes with a desired distribution, and then realizing reliable transmission of those amplitudes by (i) using an FEC encoder to encode the bit-words (binary labels) corresponding to the amplitudes and (ii) placing the resulting parity bits into the sign bits of constellation symbols. However, for an FEC code of a given rate R, the size of a pulse-amplitude-modulation (PAM) constellation that can be used in this scheme may be limited by the following inequality:

$$m \leq \frac{1}{1-R} \quad (1)$$

where m is the modulation order; and $2^m$ is the number of constellation points in (the size of) the PAM constellation. For example, for R=5/6, the largest PAM constellation that can be used in this scheme is a $2^6$-PAM. For comparison, some applications, such as contemporary DSL systems, may require the use of at least a $2^8$-PAM constellation. An increase of the FEC-code rate R to 7/8 or 8/9 may not be able to solve this problem, e.g., because a high rate R may lead to an unacceptable performance penalty for some lower modulation orders.

At least some of the above-indicated problems are addressed by various embodiments employing a coding scheme in which (i) the amplitudes of transmitted constellation symbols are generated using a shaping encoder; (ii) some transmitted constellation symbols carry, as sign bits, the parity-bit values generated by an FEC encoder by operating on a subset of the bits from the binary labels of the shaped amplitudes and an additional set of unshaped information bits; and (iii) some other transmitted constellation symbols carry, as sign bits, the bit values of said additional set of unshaped information bits. In an example embodiment configured to operate in this manner using a $2^m$-PAM constellation, Eq. (1) no longer applies as an upper limit of the modulation order m. As a result, in some embodiments, the modulation order m can be increased, e.g., to m≥8, without a penalizing increase of the rate R of the FEC code.

FIG. 1 shows a block diagram of a DMT system 100 in which various embodiments can be practiced. System 100 comprises a distribution point unit (DPU) 110 and a plurality of customer-premise-equipment (CPE) units $150_1$-$150_n$ connected by way of subscriber lines $140_1$-$140_n$ as indicated in FIG. 1. In some embodiments, DPU 110 may be located at a "central office" of the service provider (e.g., a telephone company). In some other embodiments, DPU 110 may be remotely deployed using one or more backhaul (e.g., optical) links to a location that is closer to subscriber premises than that of the central office, and the corresponding equipment can be physically placed in a street cabinet, on a pole, in the basement of a building, etc. CPE units $150_1$-$150_n$ are typically located at different respective customer sites.

Each of subscriber lines $140_1$-$140_n$ typically comprises a respective "twisted-pair" cable configured to transmit signals corresponding to both voice and data services. At DPU 110, each of subscriber lines $140_1$-$140_n$ is connected to a respective one of input/output (I/O) ports $138_1$-$138_n$. At the CPE side, each of subscriber lines $140_1$-$140_n$ is similarly connected to a respective one of I/O ports $142_1$-$142_n$, each being an I/O port of a respective one of CPE units $150_1$-$150_n$.

In an example embodiment, DPU 110 comprises a plurality of transceivers ($120_i/130_i$), each internally connected to a respective one of I/O ports $142_1$-$142_n$, where i=1, 2, . . . , n. A transceiver ($120_i/130_i$) includes a respective transmitter $120_i$ and a respective receiver $130_i$. A CPE unit $150_i$ comprises a transceiver ($160_i/170_i$) internally connected to I/O port $142_i$ of that CPE unit. A transceiver ($160_i/170_i$) includes a respective transmitter $160_i$ and a respective receiver $170_i$. Transmitter $160_i$ can be functionally similar to transmitter $120_i$. Receiver $170_i$ can be functionally similar to receiver $130_i$. Example embodiments of transmitters 120, 160 are described in more detail below in reference to FIGS. 2 and 5-8. Example embodiments of receivers 130, 170 are described in more detail below in reference to FIGS. 3 and 9-10.

Figure 2:
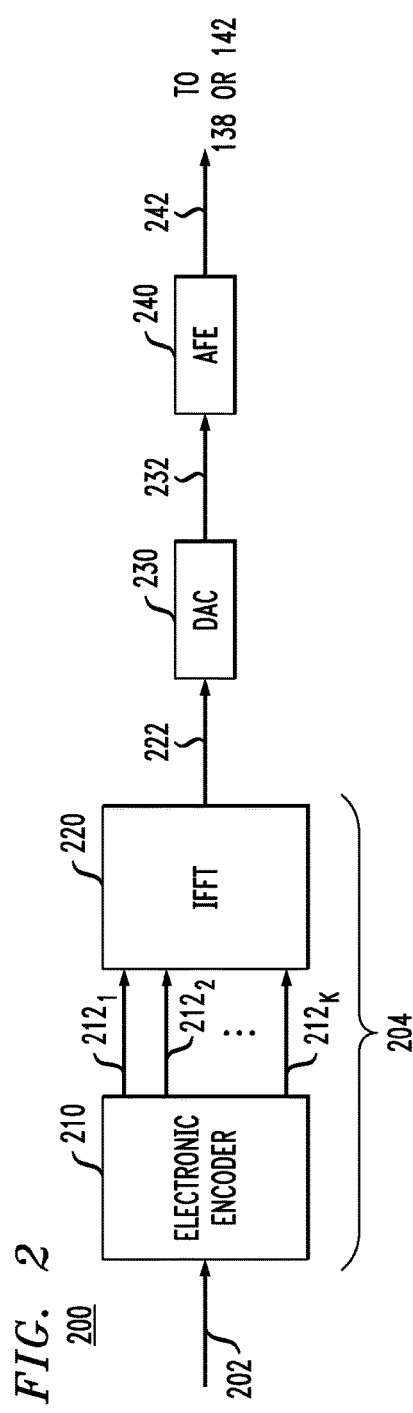
FIG. 2 shows a block diagram of a transmitter that can be used in the DMT system of FIG. 1 according to an embodiment.

FIG. 2 shows a block diagram of a transmitter 200 that can be used in system 100 (FIG. 1) according to an embodiment. Transmitter 200 comprises a digital signal processor (DSP) 204, a digital-to-analog converter (DAC) 230, and an analog front end (AFE) 240. Different instances of transmitter 200 can be used to implement some or all of transmitters $120_1$-$120_n$ and/or $160_1$-$160_n$ (FIG. 1).

DSP 204 operates to carry out redundant data encoding and digital carrier multiplexing to generate a digital output signal 222 having encoded thereon an input data stream 202. DAC 230 operates to convert digital signal 222 into an analog form to generate a corresponding analog electrical radio-frequency (RF) signal 232. AFE 240 then converts signal 232 into a form suitable for transmission over a subscriber line 140 and applies a resulting modulated electrical signal 242 to a corresponding I/O port 138 or 142.

In an example embodiment, DSP 204 comprises an electronic encoder 210 and an inverse fast-Fourier-transform (IFFT) module 220. Electronic encoder 210 carries out redundant data encoding that includes, inter alia, probabilistic signal shaping, FEC encoding, and constellation and carrier mapping to generate constellation-symbol sequences $212_1$-$212_K$, each carrying constellation symbols intended for transmission using a different respective tone (carrier wave) of a different respective frequency. IFFT module 220 then uses an inverse Fourier transform, as known in the pertinent art, to perform digital carrier multiplexing, thereby converting sequences $212_1$-$212_K$ into a corresponding time-domain digital signal 222. Depending on the specific embodiment, the number K of tones used in transmitter 200 can be on the order of one hundred, one thousand, or even greater than one thousand.

Example embodiments of electronic encoder 210 are described in more detail below in reference to FIGS. 5-8.

AFE 240 can be a conventional transmitter AFE circuit. Example transmitter AFE circuits suitable for implementing AFE 240 are briefly reviewed, e.g., by N. Stojkovic in "ADSL Analog Front End," AUTOMATIKA v. 47 (2006), no. 1-2, pp. 59-67, which is incorporated herein by reference in its entirety.

Figure 3:
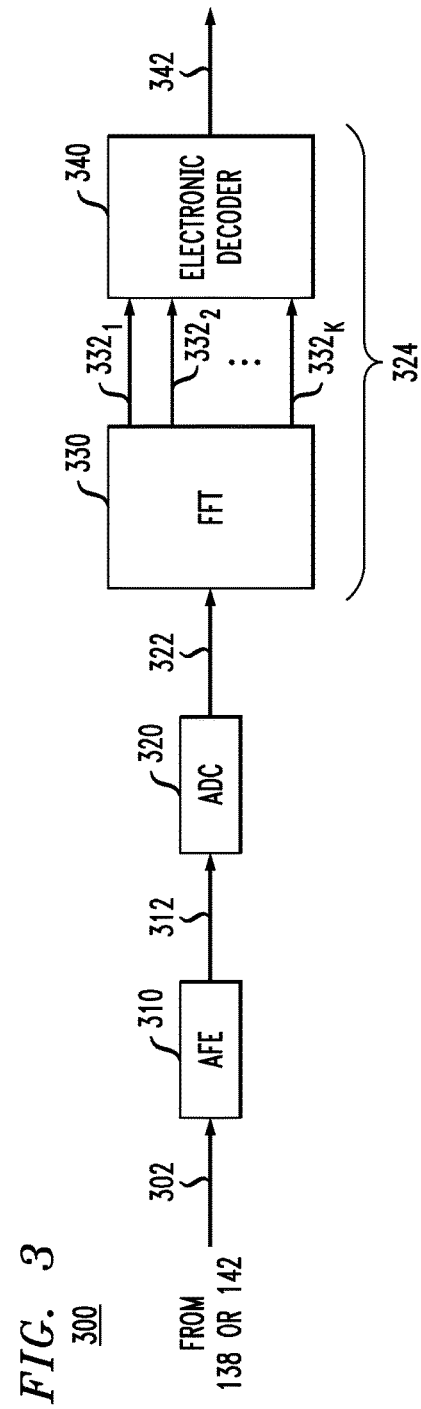
FIG. 3 shows a block diagram of a receiver that can be used in the DMT system of FIG. 1 according to an embodiment.

FIG. 3 shows a block diagram of a receiver 300 that can be used in system 100 (FIG. 1) according to an embodiment. Receiver 300 comprises an AFE 310, an analog-to-digital converter (ADC) 320, and a DSP 324. Different instances of receiver 300 can be used to implement some or all of receivers $130_1$-$130_n$ and/or $170_1$-$170_n$ (FIG. 1).

AFE 310 operates to convert a modulated electrical input signal 302 received through a corresponding I/O port 138 or 142 into a corresponding analog electrical RF signal 312 suitable for digitization in ADC 320. The typical analog signal processing applied to input signal 302 in AFE 310 includes amplification and filtering. Example receiver AFE circuits suitable for implementing AFE 310 are briefly reviewed, e.g., in the above-cited paper by N. Stojkovic. In some embodiments, an AFE 310 and an AFE 240 belonging to the same transceiver or modem can share some circuit elements, such as a clocking system and an electrical hybrid.

ADC 320 operates to sample signal 312 at an appropriate sampling rate to generate a corresponding sequence 322 of digital samples (values).

In an example embodiment, DSP 324 comprises a fast-Fourier-transform (FFT) module 330 and an electronic decoder 340. FFT module 330 uses a Fourier transform, as known in the pertinent art, to perform digital carrier de-multiplexing, thereby converting sequence 322 into the corresponding frequency-domain digital sequences $332_1$-$332_K$. Electronic decoder 340 then applies constellation and carrier demapping, error correction, and redundancy decoding to recover the data stream 202 encoded by the corresponding transmitter onto the output signal 242 that caused receiver 300 to receive input signal 302 (also see FIG. 2). The recovered data stream 202 is then directed to external circuits by way of a digital output signal 342.

Example embodiments of electronic decoder 340 are described in more detail below in reference to FIGS. 9-10.

Figure 4C:
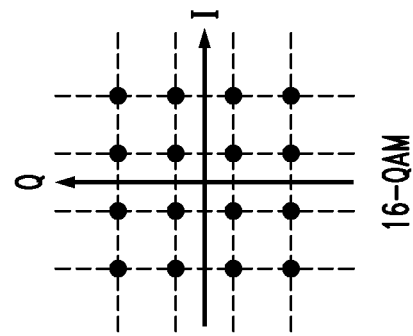
FIGS. 4A-4C graphically show example constellations that can be used in the DMT system of FIG. 1 according to some embodiments.
Figure 4B:
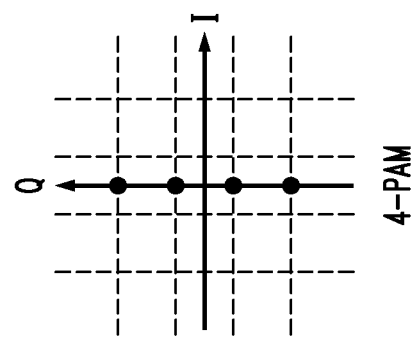
Figure 4A:
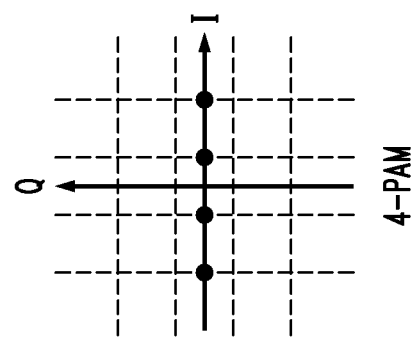

FIGS. 4A-4C graphically show several constellations that can be used in system 100 according to several example embodiments. Each of the shown constellations is depicted as a set of constituent constellation points on a complex plane whose axes are labeled as the I (in-phase) axis and the Q (quadrature) axis.

FIG. 4A graphically shows a 4-PAM (pulse-amplitude-modulation) constellation 410. The four constellation points of constellation 410 are all located on the I-axis and can be represented by the real numbers −3, −1, +1, and +3. Each of the constellation points can be used to encode two bits. In an example bit assignment, the first of the two bits (e.g., the most-significant bit, MSB) can represent the sign of the corresponding real number, and the second of the two bits (e.g., the least-significant bit, LSB) can represent the absolute value (e.g., the amplitude) of the corresponding real number. In this bit assignment scheme, the two bits assigned to a constellation point can be referred to as the sign bit and the amplitude bit, respectively.

FIG. 4B graphically shows a 4-PAM constellation 420. The four constellation points of constellation 420 are all located on the Q-axis and can be represented by the imaginary numbers −3j, −j, +j, and +3j. Each of the constellation points can be used to encode two bits in a manner similar to that of constellation 410 (FIG. 4A).

FIG. 4C graphically shows a 16-QAM (quadrature-amplitude-modulation) constellation 430. A person of ordinary skill in the art will understand that constellation 430 can be generated using a combination of constellations 410 and 420. For example, constellation 430 can be conceptually viewed as constellation 410 (FIG. 4A) in which each constellation point is split into four points using constellation 420 (FIG. 4B). Using the latter concept, electronic encoder 210 can be configured to generate one of sequences $212_1$-$212_K$ that carries constellation symbols (points) of constellation 430 by (i) generating the I component of a constellation symbol using constellation 410, (ii) generating the Q component of the constellation symbol using constellation 420, and (iii) appropriately combining the I and Q components.

A person of ordinary skill in the art will understand that other constellations that differ from the example constellations of FIGS. 4A-4C can also be used in system 100. For example, a q-PAM constellation (where q is an even integer greater than four) can be constructed by expanding constellation 410, e.g., by placing additional constellation points on the I axis (see FIG. 4A). An l-PAM constellation (where l is an even integer greater than four) can similarly be constructed by expanding constellation 420, e.g., by placing additional constellation points on the Q axis (see FIG. 4B). A corresponding electronic encoder 210 can then be configured to generate one of sequences $212_1$-$212_K$ that carries constellation symbols of a (q×l)-QAM constellation by (i) generating the I component of a constellation symbol using the q-PAM constellation, (ii) generating the Q component of the constellation symbol using the l-PAM constellation, and (iii) appropriately combining the I and Q components. In some embodiments, the number (l×q) of constellation points in a QAM constellation can be, e.g., $2^{16}$, $2^{18}$, $2^{20}$, or even more.

For illustration purposes and without any implied limitation, example embodiments are described herein below in reference to a PAM constellation, such as that analogous to constellation 410 (FIG. 4A) or 420 (FIG. 4B). Based on the provided description, a person of ordinary skill in the art will be able to make and use, without any undue experimentation, alternative embodiments in which system 100 is configured to use PAM and/or QAM constellations of any desired size, e.g., constructed as indicated above.

Figure 5:
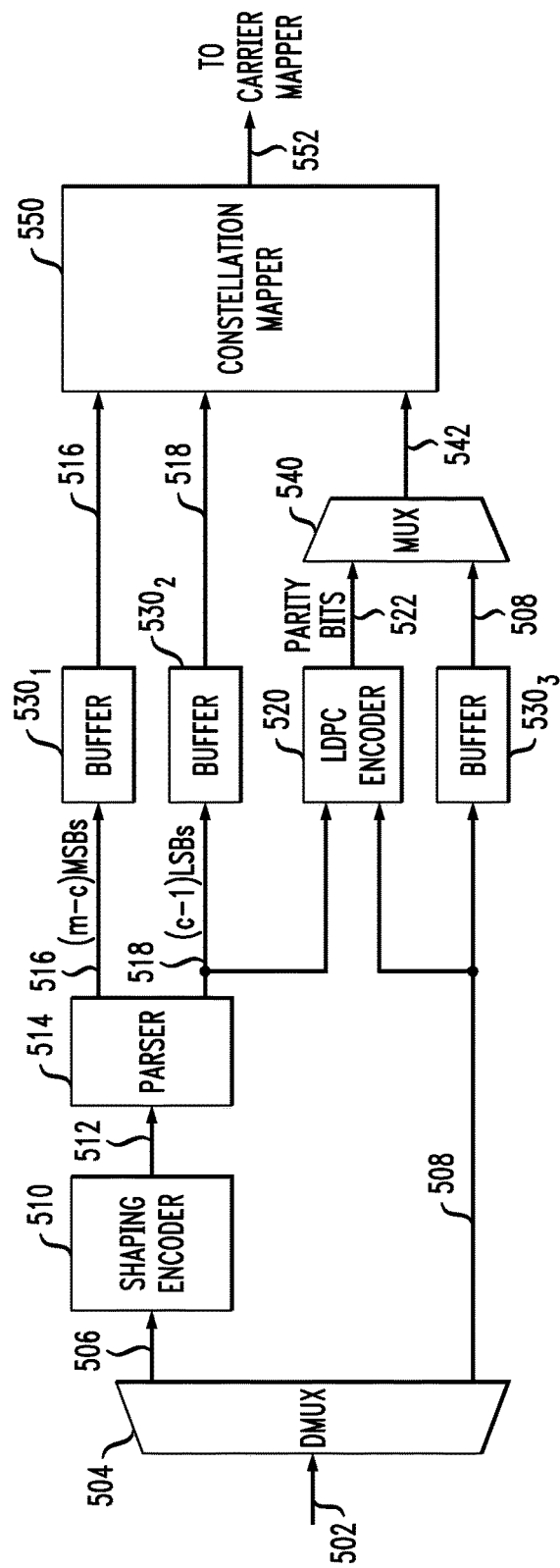
FIG. 5 shows a block diagram of a digital circuit that can be used in the transmitter of FIG. 2 according to an embodiment.

FIG. 5 shows a block diagram of a digital circuit 500 that can be used in transmitter 200 (FIG. 2) according to an embodiment. More specifically, circuit 500 can be a part of electronic encoder 210. In some embodiments, electronic encoder 210 may include two or more instances (nominal copies) of circuit 500 connected in parallel with one another.

Digital circuit 500 operates to convert an input data stream 502 into an output stream 552 of constellation symbols, wherein constellation symbols of different amplitudes have different respective rates of occurrence due to the encoding applied by a shaping encoder 510. At least some of the sign bits of the constellation symbols in output stream 552 carry parity bits generated by an LDPC encoder 520.

Input data stream 502 may be configured to carry data transfer units (DTUs) or frames, each of which is a structured data block intended for transmission and, if necessary, retransmission as a whole unit. A typical DTU includes a DTU header, a payload portion, and a cyclic-redundancy-check (CRC) portion. In some embodiments, data stream 502 may not carry an entire DTU. For example, if multiple parallel circuits 500 are used, then each circuit 500 may be configured to process a respective part of a DTU, with different parts of the same DTU being processed by different respective instances of circuit 500. A person of ordinary skill in the art will readily understand how to generate input data stream 502 using input data stream 202 (FIG. 2).

Output stream 552 is typically directed to a carrier mapper that operates to distribute the constellation symbols received from one or more circuits 500 among constellation-symbol sequences $212_1$-$212_K$. As already indicated above, each of constellation-symbol sequences $212_1$-$212_K$ is transmitted using a different respective frequency component of modulated electrical signal 242 (see FIG. 2).

Circuit 500 includes a demultiplexer (DMUX) 504 that partitions input data stream 502 to generate data streams 506 and 508. Data stream 506 is applied to shaping encoder 510. Data stream 508 is applied to LDPC encoder 520. The relative bit rates of data streams 506 and 508 are determined by the rates of the codes used in shaping encoder 510 and LDPC encoder 520 and by the size(s) of the constellation(s) used in constellation mapper 550.

In an example embodiment, shaping encoder 510 is configured to carry out fixed-in/fixed-out (FIFO) probabilistic signal shaping under which a fixed-size block of input data 506 is converted into a fixed-size set of bit-words of an output sequence 512. Typically, the statistical properties of input data 506 are similar to those of a random or pseudo-random data sequence. However, different bit-word values in output sequence 512 have different respective rates of occurrence dictated by the shaping code used by shaping encoder 510. In different embodiments, the shaping code can be configured to cause output sequence 512 to have any selected distribution of bit-word values. Some examples of such distributions include, but are not limited to an exponential distribution, a Gaussian distribution, and a Maxwell-Boltzmann distribution. A person of ordinary skill in the art will understand that the shaping code achieves a desired distribution of bit-word values by redundancy-encoding input data 506.

In some embodiments, shaping encoder 510 may be configured to perform the above-mentioned FIFO conversion in a "streaming" fashion such that the ratio between the number of bits supplied by input data 506 and the number of bit-words in the corresponding output sequence 512 remains constant and does not depend on the size or binary contents of input data 506 after the shaping encoder has executed the pertinent initialization procedures. This feature is different from the corresponding feature of some other probabilistic-signal-shaping schemes in which either the size of the input data block or the size of the output set of bit-words, or both, may depend on the binary contents of the input data block. Different variants of such probabilistic-signal-shaping schemes are often referred-to in the relevant literature as variable-in/fixed-out (VIFO), fixed-in/variable-out (FIVO), and variable-in/variable-out (VIVO) schemes.

In some embodiments, shaping encoder 510 may be configured to generate output sequence 512 using a VIFO shaping code.

A person of ordinary skill in the art will appreciate that the shaping code used in shaping encoder 510 and the constellation used in constellation mapper 550 are designed and configured to be compatible with one another. Some of the parameters that are taken into account to ensure this compatibility include, but are not limited to the use of the same modulation order m and of the same binary labels for the shaped amplitudes and the corresponding constellation points.

A bit-word parser 514 operates to parse each bit-word of sequence 512 into two shorter bit-words. For example, if the bit-word length in sequence 512 is (m−1) bits, then the (m−c) MSBs of each bit word are used to form the corresponding bit-words for a parsed sequence 516, and the remaining (c−1) LSBs of each bit word are used to form the corresponding bit-words for a parsed sequence 518. Here, m denotes the number of bits encoded in each constellation symbol of the constellation used in constellation mapper 550.

LDPC encoder 520 uses copies of data stream 508 and sequence 518 to form blocks of bits, to which the LDPC encoder applies the operative LDPC code to generate the corresponding blocks of parity bits. The blocks of parity bits are serialized to form a data stream 522.

A multiplexer (MUX) 540 multiplexes data streams 508 and 522 to generate a corresponding data stream 542. A buffer $530_3$ operates to appropriately align in time the data streams 508 and 522 prior to their application to MUX 540. Buffers $530_1$ and $530_2$ operate to appropriately align in time the sequences 516 and 518 with data stream 542 prior to their application to constellation mapper 550. These alignments in time are performed, e.g., to account for different processing delays in different signal-processing paths between DMUX 504 and constellation mapper 550. A person of ordinary skill in the art will understand that the majority of these delays are typically caused by the processing performed in shaping encoder 510 and LDPC encoder 520.

Constellation mapper 550 uses the operative $2^m$-PAM constellation to convert sequences 516 and 518 and data stream 542 into output stream 552, wherein each constellation symbol encodes m bits. The (m−1) bits provided by the corresponding bit-words of sequences 516 and 518 determine the amplitude of the constellation symbol, and the corresponding bit provided by data stream 542 determines the sign of the constellation symbol. An example embodiment of constellation mapper 550 is described in more detail below in reference to FIG. 6.

If R (=L/N) is the rate of the LDPC code used in LDPC encoder 520, then a fraction γ of the constellation symbols in output stream 552 will carry the sign bits provided by data stream 508, while the remaining fraction (1−γ) of the constellation symbols will carry the sign bits provided by data stream 522, with the average value of γ given by Eq. (2) as follows:

$$\gamma = 1-(1-R)c \qquad (2)$$

where L is the length of the input block of bits of the LDPC code; and (N−L) is the length of the block of parity bits generated by the LDPC code using the input block. The average number S of constellation symbols corresponding to the input block of length L is given by Eq. (3) as follows:

$$S = L/(c-1+\gamma) = N/c \qquad (3)$$

In some embodiments, the fraction γ and the number S do not need to be constant, but can change from one LDPC codeword to another LDPC codeword. In such embodiments, Eqs. (2)-(3) may need to be modified to replace the fixed value of c by an average value thereof, with the average taken over several corresponding LDPC codewords. In addition, all the coded bits corresponding to any particular constellation symbol in output stream 552 do not necessarily need to belong to the same LDPC codeword, but can be spread across several LDPC codewords.

Figure 6:
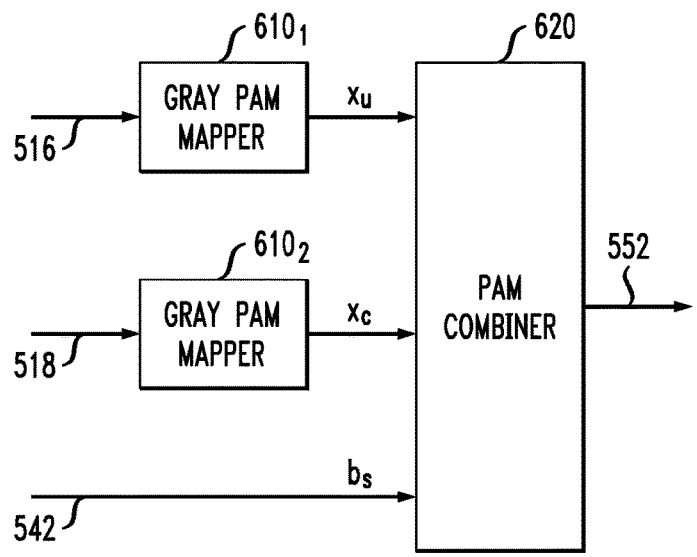
FIG. 6 shows a block diagram of a constellation mapper that can be used in the digital circuit of FIG. 5 according to an embodiment.

FIG. 6 shows a block diagram of constellation mapper 550 according to an embodiment. As shown, constellation mapper 550 comprises Gray PAM mappers $610_1$ and $610_2$ and a PAM combiner 620 connected as indicated in FIG. 6.

In an example embodiment, Gray PAM mapper $610_1$ is a conventional Gray PAM mapper configured to operate on (m−c) bits provided by a bit-word of sequence 516. More specifically, mapper $610_1$ operates to map the (m−c) bits onto one of the Gray-labeled constellation points {1, 3, ..., $(2^{m-c+1}-1)$} of the corresponding $2^{m-c}$-PAM constellation. Gray PAM mapper $610_2$ is a conventional Gray PAM mapper configured to operate on (c−1) bits provided by a bit-word of sequence 518. More specifically, mapper $610_2$ operates to map the (c−1) bits onto one of the Gray-labeled constellation points {1, 3, ..., $(2^c-1)$} of the corresponding $2^{c-1}$-PAM constellation. Buffers $530_1$ and $530_2$ are configured such that the bit-words on which Gray PAM mappers

610₁ and 610₂ operate in the same time slot originate from the same bit-word of sequence 512 (also see FIG. 5).

PAM combiner 620 operates to convert the three inputs that it receives into a corresponding constellation point of the corresponding $2^m$-PAM constellation. In each time slot, the three inputs include: (i) a constellation point $x_u$ provided by mapper 610₁; (ii) a constellation point $x_c$ provided by mapper 610₂; and (iii) a sign bit $b_s$ provided by data stream 542. In an example embodiment, PAM combiner 620 converts the three inputs into a corresponding constellation point x for output stream 552 in accordance with Eq. (4):

$$x = (-1)^{1+b_s}(x_c + 2^{c-1}(x_u - 1)) \qquad (4)$$

Figure 7:
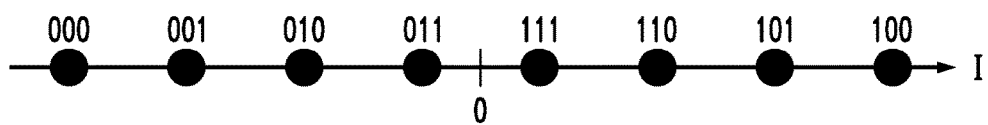
FIG. 7 graphically illustrates an example of constellation mapping performed by the constellation mapper of FIG. 6 according to an embodiment.

FIG. 7 graphically illustrates an example of constellation mapping performed by constellation mapper 550 according to an embodiment. The shown example uses an 8-PAM constellation 700 (i.e., m=3) in which the bit-words (binary labels) assigned to different constellation points are generated by an embodiment of constellation mapper 550 corresponding to m=3 and c=2.

In the illustrated embodiment, constellation mapper 550 is configured to use a reflected double-Gray mapping scheme, in which the constellation points located in the positive I-half of constellation 700 have binary-amplitude labels (i.e., the labels that do not include the sign bit) generated using conventional double-Gray mapping, while the constellation points located in the negative I-half of the constellation have binary labels generated by flipping the signs of the corresponding constellation points located in the positive I-half. With this type of mapping, the amplitude labels of the constellation points are symmetric, and the sign bits of the constellation points are anti-symmetric with respect to the origin of the I-axis. In some alternative embodiments, a similar approach can be used to generate binary labels for a constellation or a constellation portion that uses the Q dimension of the complex plane.

The MSB of each binary label in constellation 700 represents the corresponding bit of data stream 542. The middle bit of each binary label in constellation 700 represents the corresponding bit of sequence 516. The LSB of each binary label in constellation 700 represents the corresponding bit of sequence 518.

Figure 8:
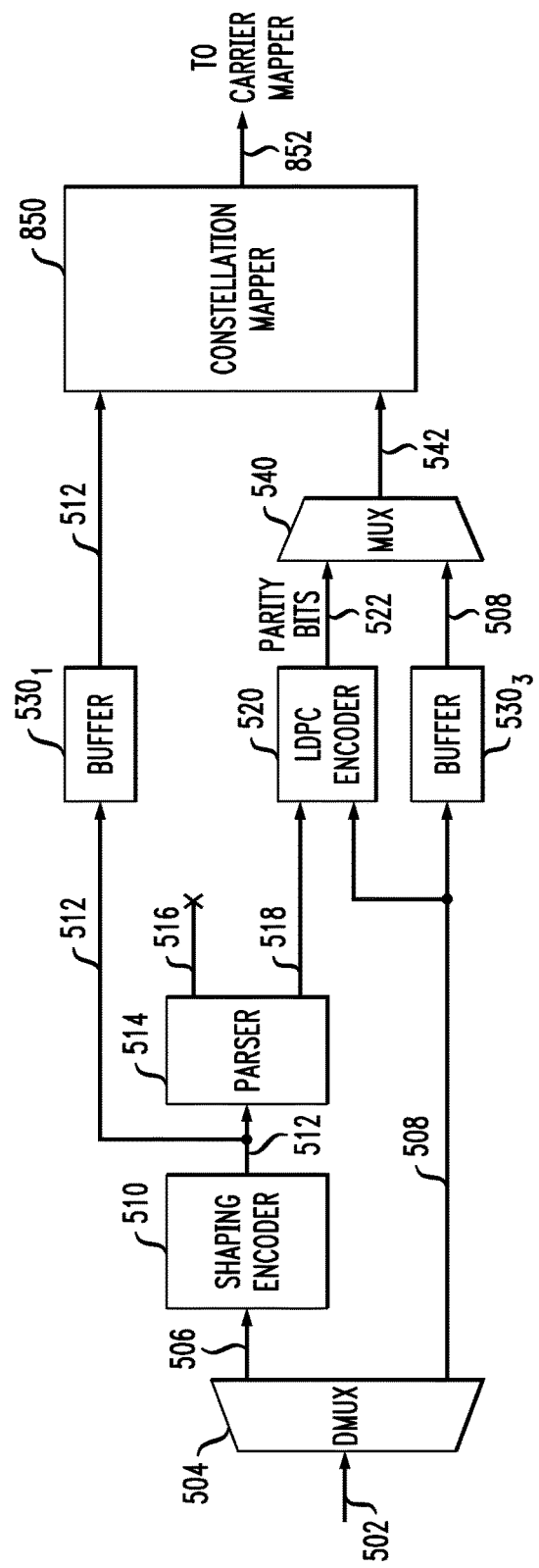
FIG. 8 shows a block diagram of a digital circuit that can be used in the transmitter of FIG. 2 according to an alternative embodiment.

FIG. 8 shows a block diagram of a digital circuit 800 that can be used in transmitter 200 (FIG. 2) according to an alternative embodiment. Similar to circuit 500 (FIG. 5), circuit 800 can be a part of electronic encoder 210. In some embodiments, electronic encoder 210 may include two or more instances (nominal copies) of circuit 800 connected in parallel with one another.

Circuit 800 uses many of the same circuit elements as circuit 500. The description of these elements is not repeated here. Rather, the description of circuit 800 primarily focuses on the differences between circuits 800 and 500.

In circuit 800, sequence 516 is discarded. Buffer 530₁ is configured to buffer bit-words of sequence 512 instead of sequence 516. Buffer 530₂ (see FIG. 5) is not present. Constellation mapper 550 (see FIGS. 5-6) is replaced by a constellation mapper 850.

In an example embodiment, constellation mapper 850 is a conventional constellation mapper configured to use a $2^m$-PAM constellation and the above-described reflected double-Gray mapping to convert sequence 512 and data stream 542 into an output stream 852 of constellation symbols, wherein each constellation symbol encodes m bits. The (m−1) bits provided by sequence 512 determine the amplitude of the constellation symbol, and the corresponding bit provided by data stream 542 determines the sign of the constellation symbol.

Similar to output stream 552 (FIG. 5), output stream 852 has different respective rates of occurrence for constellation symbols of different amplitudes due to the encoding performed by shaping encoder 510. Output stream 852 is typically directed to a carrier mapper that operates to distribute the constellation symbols received from one or more circuits 800 among constellation-symbol sequences 212₁-212_K. As already indicated above, each of constellation-symbol sequences 212₁-212_K is transmitted using a different respective frequency component of modulated electrical signal 242 (see FIG. 2).

Figure 9:
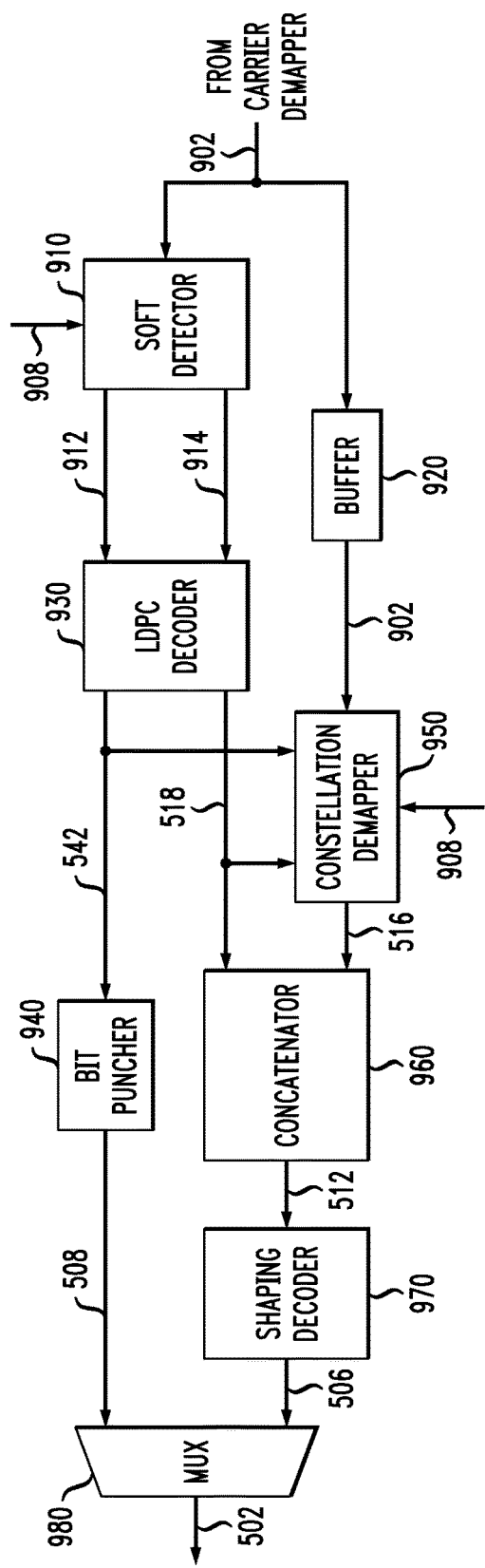
FIG. 9 shows a block diagram of a digital circuit that can be used in the receiver of FIG. 3 according to an embodiment.

FIG. 9 shows a block diagram of a digital circuit 900 that can be used in receiver 300 (FIG. 3) according to an embodiment. More specifically, circuit 900 can be a part of electronic decoder 340. In some embodiments, electronic decoder 340 may include two or more instances (nominal copies) of circuit 900 connected in parallel with one another.

Circuit 900 operates to recover data stream 502 (also see FIGS. 5 and 8) in response to receiving a corresponding input stream 902 of digital samples (values) from a carrier demapper of electronic decoder 340. In an example embodiment, the carrier demapper generates input stream 902 by appropriately transferring thereto digital samples from one or more sequences 332₁-332_K generated by FFT module 330 of the corresponding receiver 300, e.g., as described above in reference to FIG. 3.

Circuit 900 includes a soft information detector 910 configured to calculate log-likelihood ratios (LLRs) corresponding to the bits encoded by LDPC encoder 520. This calculation can be performed as known in the pertinent art, e.g., using prior information 908 of the corresponding amplitude distributions. Detector 910 is typically configured to calculate c LLRs per digital sample of input stream 902. The LLRs corresponding to the sign bits are directed to an LDPC decoder 930 by way of an LLR stream 912. The LLRs corresponding to the encoded LSBs are similarly directed to LDPC decoder 930 by way of an LLR stream 914.

LDPC decoder 930 operates to process the LLRs provided by LLR streams 912 and 914 to recover the corresponding codewords of the LDPC code used by LDPC encoder 520. The bits representing the sign bits are then extracted from each recovered LDPC codeword to reconstruct data stream 542. The bits representing the encoded LSBs are also extracted from each recovered LDPC codeword to reconstruct sequence 518 (also see FIGS. 5 and 8).

A bit puncher 940 operates to discard (punch out) from data stream 542 the bits corresponding to parity bit stream 522, thereby reconstructing data stream 508.

A constellation demapper 950 uses a delayed copy of input stream 902 and copies of data stream 542 and sequence 518 to reconstruct sequence 516 (also see FIGS. 5 and 8). In some embodiments, the demapping performed by constellation demapper 950 may rely on some or all of prior information 908. A buffer 920 is configured to delay input stream 902 to account for the processing delay introduced by soft information detector 910 and LDPC decoder 930 such that, in each time slot, the bits provided to constellation demapper 950 by data stream 542 and sequence 518 originate from the digital sample provided by input stream 902.

Figure 10:
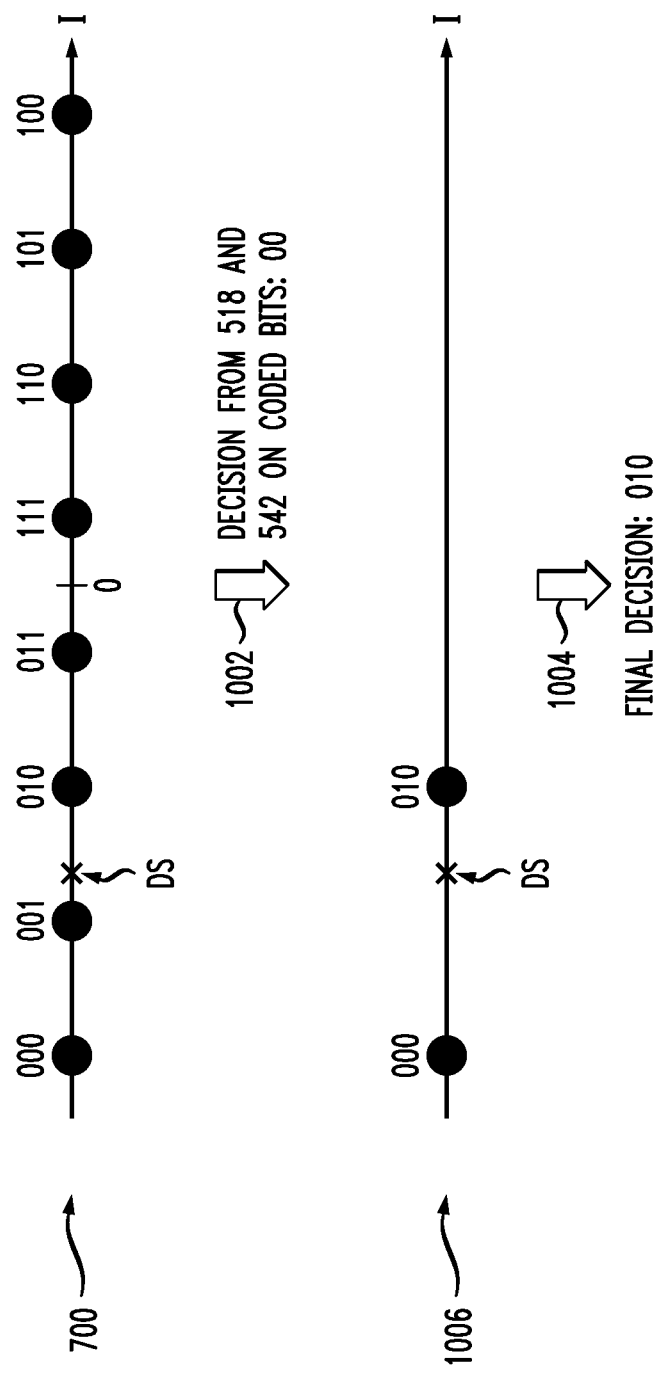
FIG. 10 graphically illustrates an example of constellation demapping performed by the digital circuit of FIG. 9 according to an embodiment.

FIG. 10 graphically illustrates an example of constellation demapping performed by constellation demapper 950 according to an embodiment. The shown example corresponds to constellation 700 (FIG. 7) and represents an embodiment in which m=3 and c=2.

The top trace in FIG. 10 shows constellation 700 with a digital sample DS provided by input stream 902 being marked therein.

At step 1002 of the demapping procedure, constellation demapper 950 operates to reduce the size of constellation 700 by removing therefrom the constellation points whose binary labels differ, in the corresponding bit positions, from the bit values provided by data stream 542 and sequence 518. As an example, the bottom trace in FIG. 10 shows a reduced constellation 1006 that can be generated at step 1002 when the bit values provided by data stream 542 and sequence 518 in the corresponding time slot are zero and zero. As a result, in constellation 1006, each of the constellation points has a respective binary label in which the MSB (sign bit) is zero and the LSB zero. A person of ordinary skill in the art will understand that other reduced constellations corresponding to other combinations of the bit values provided by data stream 542 and sequence 518 can similarly be generated at other instances of step 1002.

At step 1004 of the demapping procedure, constellation demapper 950 operates to map the digital sample DS onto the most-probable constellation point of the reduced constellation generated at step 1002. As used herein, the term "most probable" should be interpreted to mean the constellation point that has the highest probability of causing the receiver to generate the digital sample DS in response to receiving the corresponding signal. The probability of a constellation point is calculated based, inter alia, on the distance between the constellation point and DS and the prior information 908, which typically includes the probabilities with which different constellation points are transmitted due to the signal shaping applied by the corresponding transmitter. In the shown example, the binary label of the most-probable constellation point of constellation 1006 is 010. The middle bit of this binary label is extracted to recover the corresponding bit of sequence 516.

Referring back to FIG. 9, a concatenator 960 uses the reconstructed sequences 516 and 518 to reconstruct sequence 512. A person of ordinary skill in the art will understand that the operation performed by concatenator 960 is inverse to the operation performed by parser 514 (FIGS. 5 and 8).

A shaping decoder 970 operates, using the same shaping code used in shaping encoder 510, to convert bit-word sequence 512 back into data stream 506.

A MUX 980 operates to properly multiplex the recovered data streams 506 and 508 to recover data stream 502. A person of ordinary skill in the art will understand that the operation performed by MUX 980 is inverse to the operation performed by DMUX 504 (FIGS. 5 and 8).

Figure 11:
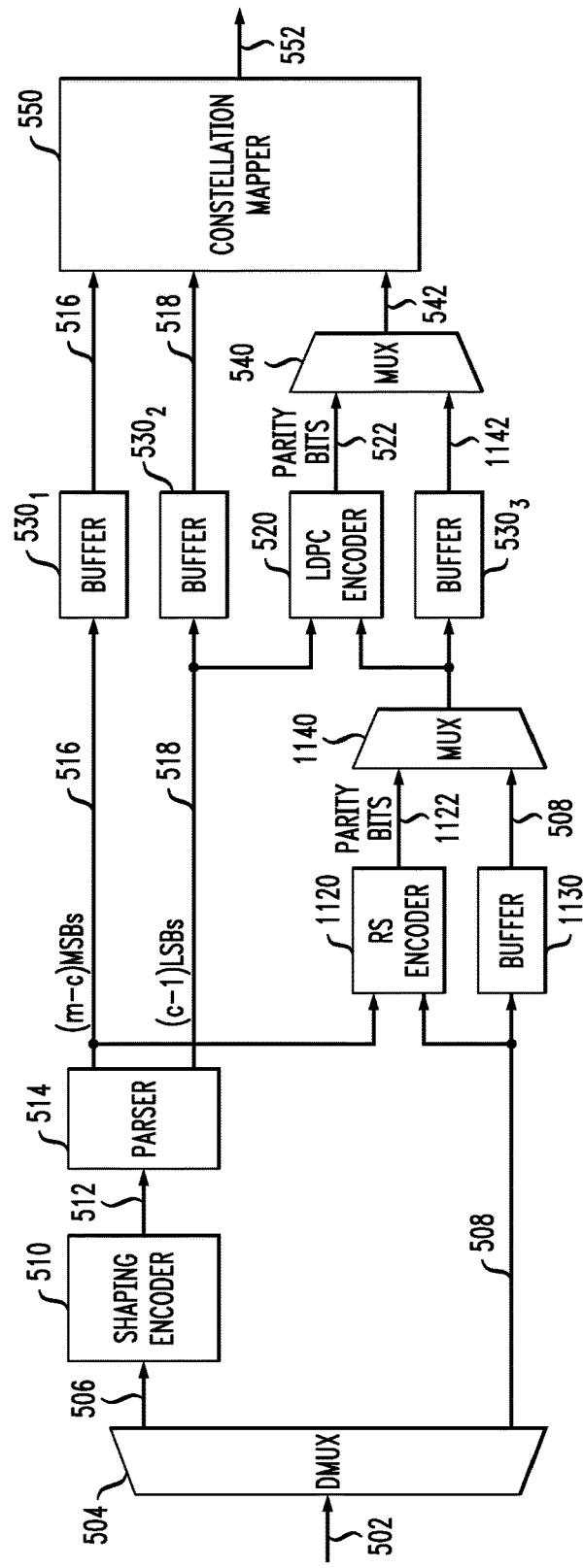
FIG. 11 shows a block diagram of a digital circuit that can be used in the transmitter of FIG. 2 according to another alternative embodiment.

FIG. 11 shows a block diagram of a digital circuit 1100 that can be used in transmitter 200 (FIG. 2) according to another alternative embodiment. Circuit 1100 is a modification of circuit 500 (FIG. 5) in which an additional (outer) layer of FEC coding is used to protect sequence 516. In the example shown in FIG. 11, the outer layer of FEC coding is implemented using a Reed-Solomon (RS) code. A person of ordinary skill in the art will understand that other implementations of the outer layer of FEC coding may use other suitable FEC codes.

The additional circuitry incorporated into circuit 1100 includes an RS encoder 1120, a buffer 1130, and a MUX 1140. RS encoder 1120 operates to generate a parity bit stream 1122 by applying the operative RS code to blocks of bits formed using copies of sequence 516 and data stream 508. Bit stream 1122 and data stream 508 are then multiplexed using MUX 1140 to generate a corresponding data stream 1142. Buffer 1130 operates to appropriately align in time the streams 508 and 1122 prior to their application to MUX 1140. Copies of data stream 1142 are applied to LDPC encoder 520 and buffer $530_3$ as indicated in FIG. 11. The time delays imposed by buffers $530_1$-$530_3$ and 1130 are appropriately selected to account for different processing delays in different signal-processing paths between DMUX 504 and constellation mapper 550.

In an example implementation, the code rate of the RS code used in RS encoder 1120 can be higher than the code rate of the LDPC code used in LDPC encoder 520. The same RS code can advantageously be used at the corresponding receiver (see, e.g., FIG. 12) to correct errors (if any) in the data corresponding to the recovered sequence 516. These errors can be caused, e.g., by the non-stationary noise induced by narrowband RF interference on some tones.

In yet another alternative embodiment, circuit 1100 may be modified to configure RS encoder 1120 to use sequence 512 instead of sequence 516.

In yet another alternative embodiment, circuit 1100 may be modified to configure RS encoder 1120 to receive a copy of sequence 516, but not receive a copy of data stream 508.

In yet another alternative embodiment, circuit 1100 may be modified to: (i) remove MUX 1140; (ii) replace MUX 540 by a three-input MUX; and (iii) configure the three input MUX to multiplex streams 1122, 522, and 508 for application of the resulting multiplexed stream to constellation mapper 550 in place of stream 542.

Figure 12:
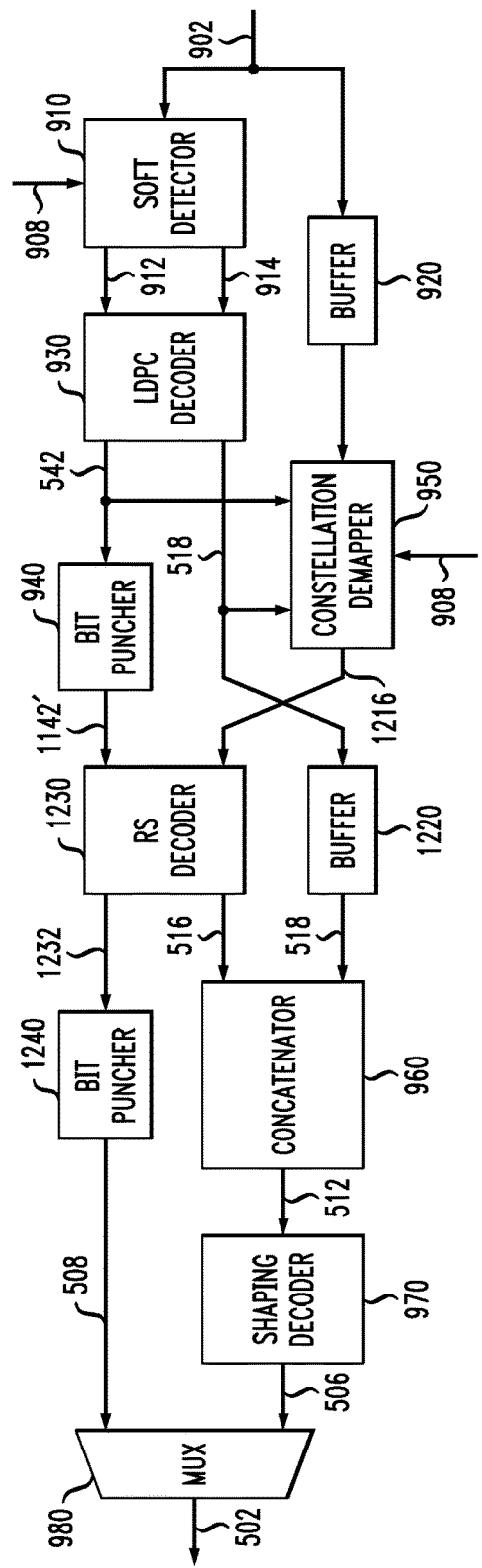
FIG. 12 shows a block diagram of a digital circuit that can be used in the receiver of FIG. 3 according to an alternative embodiment.

FIG. 12 shows a block diagram of a digital circuit 1200 that can be used in receiver 300 (FIG. 3) according to an alternative embodiment. More specifically, circuit 1200 is a modification of circuit 900 (FIG. 9), with the modifications being directed at making the decoding processing implemented in circuit 1200 compatible with the encoding processing implemented in circuit 1100 shown in FIG. 11.

The additional circuitry incorporated into circuit 1200 includes a buffer 1220, an RS decoder 1230, and a bit puncher 1240. Some additional modifications may need to be made to make the output of constellation demapper 950 compatible with the processing implemented in RS decoder 1230. Accordingly, the output of constellation demapper 950 is labeled in FIG. 12 using the reference numeral 1216 (instead of 516, as in FIG. 9). In addition, sequence 1216 may differ from sequence 516 due to possible errors.

In circuit 1200, bit puncher 940 operates to discard from data stream 542 the bits corresponding to parity bit stream 522, thereby generating data stream 1142'. Data stream 1142' may differ from data stream 1142 (FIG. 11) due to the presence of some residual errors. RS decoder 1230 operates to process the data provided by signals 1142' and 1216 to correct possible errors in both, recover the corresponding codewords 1232 of the RS code used by RS encoder 1120, and reconstruct sequence 516. The reconstructed sequence 516 is then directed to concatenator 960. Buffer 1220 operates to appropriately align in time the recovered sequences 516 and 518 prior to their application to concatenator 960. Bit puncher 1240 operates to discard from the recovered codewords 1232 the bits corresponding to sequence 516 and parity bit stream 1122, thereby reconstructing data stream 508.

A person of ordinary skill in the art will understand, without any undue experimentation, how to modify circuit 1200 to make it compatible with any one of the above-indicated alternative embodiments of circuit 1100.

Figure 13:
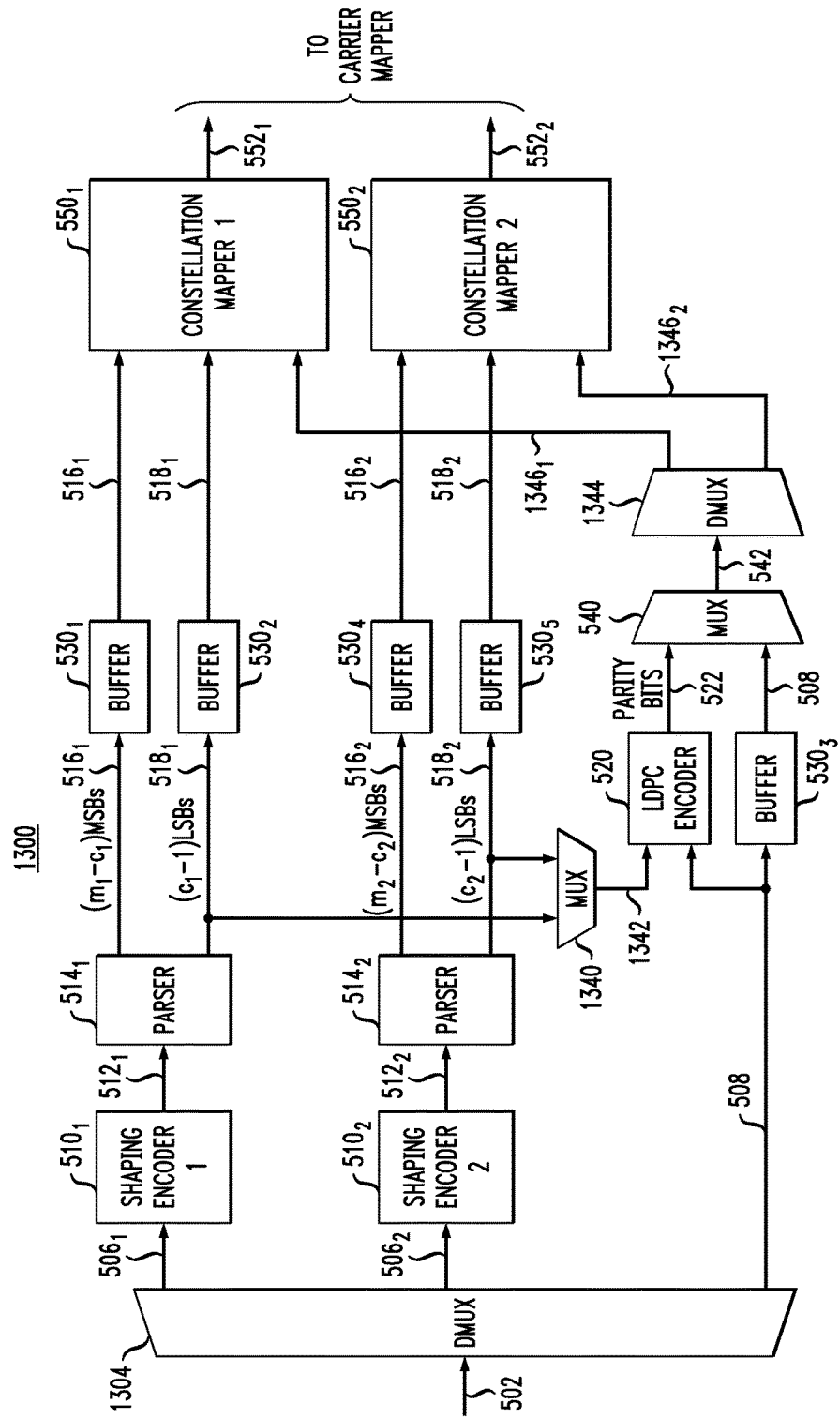
FIG. 13 shows a block diagram of a digital circuit that can be used in the transmitter of FIG. 2 according to yet another alternative embodiment.

FIG. 13 shows a block diagram of a digital circuit 1300 that can be used in transmitter 200 (FIG. 2) according to another alternative embodiment. Circuit 1300 uses many of the same circuit elements as circuit 500, which elements are labeled in FIG. 13 using the same reference numerals. For the description of those elements the reader is referred to the description of FIG. 5 above. The below-provided description of FIG. 13 primarily focuses on the differences between circuits 500 and 1300.

Circuit 1300 includes a three-output DMUX 1304 configured to demultiplex input data stream 502 into data streams $506_1$, $506_2$, and 508. Data streams $506_1$ and $506_2$ are applied to shaping encoders $510_1$ and $510_2$, respectively. Data stream 508 is applied to LDPC encoder 520 and buffer $530_3$ in the same manner as in circuit 500.

Shaping encoders $510_1$ and $510_2$ typically differ from one another in that they use different respective shaping codes. For example, each of the individual bit-words (each representing a respective shaped amplitude) of output sequence $512_1$ generated by shaping encoder $510_1$ may have a length of $(m_1-1)$ bits, where $m_1$ is the number of bits encoded in each constellation symbol of the constellation used in constellation mapper $550_1$. Each of the individual bit-words (each representing a respective shaped amplitude) of output sequence $512_2$ generated by shaping encoder $510_2$ may have a length of $(m_2-1)$ bits, where $m_2$ is the number of bits encoded in each constellation symbol of the constellation used in constellation mapper $550_2$. In an example embodiment, $m_1 \neq m_2$.

However, in some embodiments, $m_1$ and $m_2$ may have the same value (i.e., $m_1 = m_2$). In this case, the shaping codes used in shaping encoders $510_1$ and $510_2$ may differ from one another in some other characteristic, such as the respective distributions of the shaped amplitudes that are being generated.

Bit-word parser $514_1$ operates to parse each bit-word of sequence $512_1$ into two shorter bit-words. More specifically, the $(m_1-c_1)$ MSBs of each bit-word are used to form the corresponding bit-words for parsed sequence $516_1$, and the remaining $(c_1-1)$ LSBs of each bit-word are used to form the corresponding bit-words for a parsed sequence $518_1$.

Bit-word parser $514_2$ similarly operates to parse each bit-word of sequence $512_2$ into two shorter bit-words. More specifically, the $(m_2-c_2)$ MSBs of each bit-word are used to form the corresponding bit-words for parsed sequence $516_2$, and the remaining $(c_2-1)$ LSBs of each bit-word are used to form the corresponding bit-words for a parsed sequence $518_2$.

In some embodiments, $c_1 \neq c_2$. In some other embodiments, $c_1 = c_2$. When $c_1 \neq c_2$, some additional embodiments may be constructed in which shaping encoders $510_1$ and $510_2$ are configured to use the same shaping code instead of two different respective shaping codes, as indicated above.

A MUX 1340 operates to generate a data stream 1342 by appropriately multiplexing copies of sequences $518_1$ and $518_2$. Data stream 1342 is then applied to LDPC encoder 520 at the same input port thereof that was used for receiving sequence 518 in the configuration of that LDPC encoder in circuit 500 (see FIG. 5).

A DMUX 1344 operates to generate data streams $1346_1$ and $1346_2$ by appropriately demultiplexing data stream 542 received from MUX 540. Data stream $1346_1$ is then used to provide sign bits for the constellation mapping performed in constellation mapper $550_1$. Data stream $1346_2$ is similarly used to provide sign bits for the constellation mapping performed in constellation mapper $550_2$.

Buffers $530_1$-$530_5$ operate to appropriately align in time the various sequences applied to constellation mappers $550_1$ and $550_2$.

Output constellation-symbol streams $552_1$ and $552_2$ generated by constellation mappers $550_1$ and $550_2$, respectively, are directed to the carrier mapper. Depending on the embodiment, the carrier mapper may be configured to cause streams $552_1$ and $552_2$ to be transmitted, e.g., using (i) different respective individual frequency components of modulated electrical signal 242 (see FIG. 2), or (ii) two different groups of frequency components of modulated electrical signal 242, with the first of the two groups being configured to use the common modulation order $m_1$, and the second two groups being configured to use the common modulation order $m_2$. In some alternative embodiments, other suitable carrier-mapping schemes may also be used to transmit constellation streams $552_1$ and $552_2$.

Figure 14:
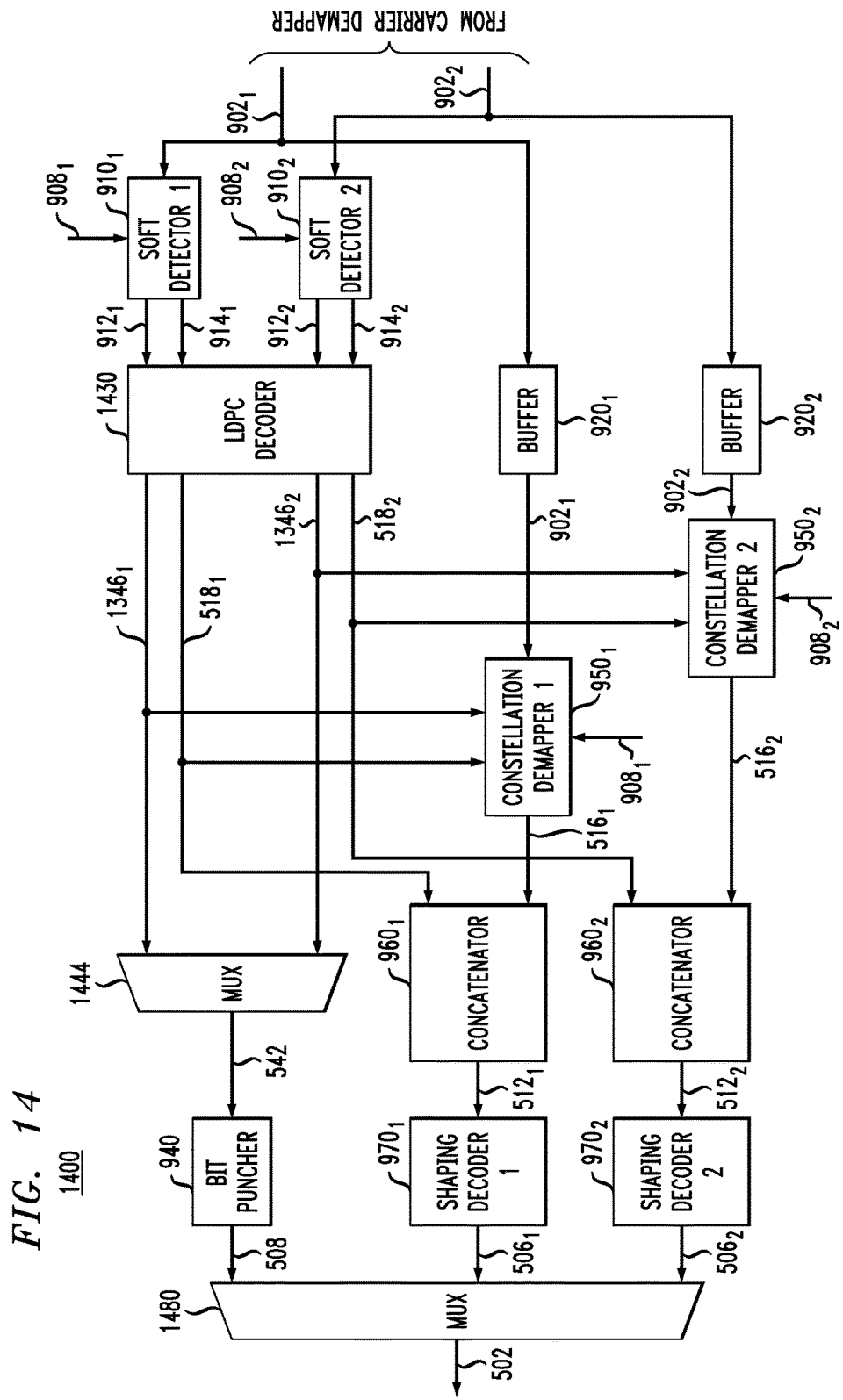
FIG. 14 shows a block diagram of a digital circuit that can be used in the receiver of FIG. 3 according to another alternative embodiment.

FIG. 14 shows a block diagram of a digital circuit 1400 that can be used in receiver 300 (FIG. 3) according to an alternative embodiment. More specifically, circuit 1400 is a modification of circuit 900 (FIG. 9), with the modifications being directed at making the decoding processing implemented in circuit 1400 to be compatible with the encoding processing implemented in circuit 1300 (FIG. 13). As shown, circuit 1400 uses many of the same circuit elements as circuit 900, which elements are labeled in FIG. 14 using the same reference numerals. For the description of those elements the reader is referred to the description of FIG. 9 above. The below-provided description of FIG. 14 primarily focuses on the differences between circuits 900 and 1400.

Circuit 1400 includes soft information detectors $910_1$ and $910_2$. Detector $910_1$ is configured to calculate LLRs corresponding to digital samples of input stream $902_1$ using prior information $908_1$ of the corresponding amplitude distributions, with $c_1$ LLRs being calculated per digital sample of input stream $902_1$. The LLRs corresponding to the sign bits are directed to an LDPC decoder 1430 by way of LLR stream $912_1$. The LLRs corresponding to the encoded LSBs are directed to LDPC decoder 1430 by way of LLR stream $914_1$. Detector $910_2$ is similarly configured to calculate LLRs corresponding to digital samples of input stream $902_2$ using prior information $908_2$ of the corresponding amplitude distributions, with $c_2$ LLRs being calculated per digital sample of input stream $902_2$. The LLRs corresponding to the sign bits are directed to LDPC decoder 1430 by way of LLR stream $912_2$. The LLRs corresponding to the encoded LSBs are directed to LDPC decoder 1430 by way of LLR stream $914_2$.

LDPC decoder 1430 operates to process the LLRs provided by LLR streams $912_1$, $912_2$, $914_1$, and $914_2$ to recover the corresponding codewords of the LDPC code used by LDPC encoder 520. The bits representing the sign bits are then extracted from each recovered LDPC codeword to reconstruct data streams $1346_1$ and $1346_2$. The bits representing the encoded LSBs are also extracted from each recovered LDPC codeword to reconstruct sequences $518_1$ and $518_2$ (also see FIG. 13).

A MUX 1444 operates to reconstruct data stream 542 by appropriately multiplexing data streams $1346_1$ and $1346_2$. The multiplexing performed by MUX 1444 is an inverse operation to the demultiplexing performed by DMUX 1344 (FIG. 13). Bit puncher 940 then punches out from data stream 542 the bits corresponding to parity bit stream 522, thereby reconstructing data stream 508.

Constellation demapper $950_1$ uses at least some of prior information $908_1$, a delayed copy of input stream $902_1$, and copies of data stream $1346_1$ and sequence $518_1$ to reconstruct sequence $516_1$ (also see FIG. 13). Constellation demapper $950_2$ similarly uses at least some of prior information $908_2$, a delayed copy of input stream $902_2$, and copies of data stream $1346_2$ and sequence $518_2$ to reconstruct sequence $516_2$ (also see FIG. 13). Buffers $920_1$ and $920_2$ are used to appropriately align in time the input signals to constellation demappers $950_1$ and $950_2$, respectively.

Concatenator $960_1$ uses the reconstructed sequences $516_1$ and $518_1$ to reconstruct sequence $512_1$. Concatenator $960_2$ similarly uses the reconstructed sequences $516_2$ and $518_2$ to reconstruct sequence $512_2$. A person of ordinary skill in the art will understand that the operations performed by concatenators $960_1$ and $960_2$ are inverse to the operations performed by parsers $514_1$ and $514_2$, respectively (see FIG. 13).

Shaping decoder $970_1$ operates, using the same shaping code used in shaping encoder $510_1$, to convert bit-word sequence $512_1$ back into data stream $506_1$. Shaping decoder $970_2$ similarly operates, using the same shaping code used in shaping encoder $510_2$, to convert bit-word sequence $512_2$ back into data stream $506_2$.

A MUX 1480 operates to properly multiplex the recovered data streams $506_1$, $506_2$, and 508 to recover data stream 502. A person of ordinary skill in the art will understand that the operation performed by MUX 1480 is inverse to the operation performed by DMUX 1304 (FIG. 13).

A person of ordinary skill in the art will understand that the concepts exemplified by circuits 1300 and 1400 can be extended to implement an electronic encoder 210 having more than two shaping encoders and a corresponding electronic decoder 340 having more than two shaping decoders connected in parallel.

Various embodiments can advantageously be used to minimize latency, e.g., by transmitting LDPC codewords using as few DMT symbols as possible. For this purpose, the constellation symbols corresponding to the same LDPC codeword can be distributed for transmission on different tones of the same DMT symbol. Either serial encoding exemplified by FIG. 5 or parallel encoding exemplified by FIG. 13 can be used to feed the corresponding carrier mapper. A similar approach can be realized at the corresponding receiver.

According to an example embodiment disclosed above, e.g., in the summary section and/or in reference to any one or any combination of some or all of FIGS. 1-14, provided is an apparatus (e.g., 110 or 150, FIG. 1) comprising a data transmitter (e.g., 200, FIG. 2) that comprises an electrical analog front end (e.g., 240, FIG. 2) and a digital signal processor (e.g., 204, FIG. 2), the digital signal processor being configured to: redundancy-encode an input data stream (e.g., 202, FIG. 2; 502, FIGS. 5, 8) to generate a first constellation-symbol stream (e.g., 552, FIG. 5; 852, FIG. 8; one of 212, FIG. 2); and drive the analog front end to cause a modulated electrical carrier generated by the analog front end to carry the first constellation-symbol stream; and wherein the digital signal processor comprises: a shaping encoder (e.g., 510, FIGS. 5, 8) configured to generate a bit-word stream (e.g., 512, FIGS. 5, 8) by encoding the input data stream using a shaping code; an FEC encoder (e.g., 520, FIGS. 5, 8) configured to generate a parity data stream (e.g., 522, FIGS. 5, 8) by encoding a subset of bits (e.g., 518, FIGS. 5, 8) of the bit-word stream using an FEC code; and a constellation mapper (e.g., 550, FIGS. 5, 6; 850, FIG. 8) configured to: use the bit-word stream to select constellation-symbol amplitudes for the first constellation-symbol stream; and use the parity data stream to select signs applied to at least some of the constellation-symbol amplitudes.

As used herein the term "subset" should be interpreted to mean "some of the contents of the corresponding set." As such, a subset is a smaller part of a larger set that consists of some but not all of the elements of the larger set.

In some embodiments of the above apparatus, the shaping code is configured to cause constellation-symbol amplitudes to approximately follow a predefined probability distribution in which at least some amplitudes have different respective probabilities of occurrence.

In some embodiments of any of the above apparatus, the first constellation-symbol stream is such that an occurrence rate of specific constellation symbols therein decreases as symbol energy increases.

In some embodiments of any of the above apparatus, the FEC encoder is configured to generate the parity data stream by encoding the subset of bits of the bit-word stream together with a subset of bits (e.g., 508, FIGS. 5, 8) of the input data stream.

In some embodiments of any of the above apparatus, the constellation mapper is configured to: use the parity data stream to select signs applied to a first subset of the constellation-symbol amplitudes; and use the subset of bits of the input data stream to select signs applied to a second subset of the constellation-symbol amplitudes.

In some embodiments of any of the above apparatus, the digital signal processor further comprises a demultiplexer (e.g., 504, FIGS. 5, 8) configured to demultiplex the input data stream into a first sub-stream (e.g., 506, FIGS. 5, 8) and a second sub-stream (e.g., 508, FIGS. 5, 8); wherein the first sub-stream is applied to the shaping encoder for being encoded therein using the shaping code; wherein a first copy of the second sub-stream is applied to the FEC encoder for being encoded therein together with the subset of bits of the bit-word stream using the FEC code; and wherein a second copy of the second sub-stream is applied (e.g., by way of 542, FIGS. 5, 8) to the constellation mapper for being used therein to select signs applied to a subset of the constellation-symbol amplitudes.

In some embodiments of any of the above apparatus, the subset of bits of the bit-word stream includes a fixed number (e.g., (c−1), FIG. 5) of LSBs from each bit-word.

In some embodiments of any of the above apparatus, the FEC code is an LDPC code.

In some embodiments of any of the above apparatus, the constellation mapper comprises: a first Gray mapper (e.g., $610_1$, FIG. 6) configured to generate a second constellation-symbol stream (e.g., $\{x_a\}$, FIG. 6) by mapping a fixed number (e.g., (m−c), FIG. 5) of MSBs from each bit-word of the bit-word stream onto a first constellation; a second Gray mapper (e.g., $610_1$, FIG. 6) configured to generate a third constellation-symbol stream (e.g., $\{x_c\}$, FIG. 6) by mapping a fixed number (e.g., (c−1), FIG. 5) of LSBs from each bit-word of the bit-word stream onto a second constellation; and a constellation-symbol combiner (e.g., 620, FIG. 6) configured to generate the first constellation-symbol stream by combining constellation symbols of the second and third constellation-symbol streams, said combining being performed (e.g., in accordance with Eq. (4)) using a stream of sign bits (e.g., 542, FIGS. 5, 6), said stream of sign bits including the parity data stream.

In some embodiments of any of the above apparatus, the digital signal processor is further configured to: redundancy-encode the input data stream (e.g., 202, FIG. 2) to generate a plurality of constellation-symbol streams (e.g., $212_1$-$212_K$, FIG. 2), said plurality of constellation-symbol streams including the first constellation-symbol stream; and drive the analog front end to generate an electrical output signal (e.g., 242, FIG. 2) having plurality of modulated electrical carriers, each of the modulated electrical carriers carrying a respective different one of the constellation-symbol streams; and use the parity data stream to select signs applied to at least some constellation-symbol amplitudes of the plurality of constellation-symbol streams.

In some embodiments of any of the above apparatus, the apparatus further comprises a modem (e.g., 150, FIG. 1), the modem including the data transmitter.

In some embodiments of any of the above apparatus, the apparatus further comprises a service distribution unit (e.g., 110, FIG. 1), the service distribution unit including the data transmitter.

In some embodiments of any of the above apparatus, the digital signal processor further comprises an additional FEC encoder (e.g., 1120, FIG. 11) configured to generate an additional parity data stream (e.g., 1122, FIG. 11) by encoding the bit-word stream (e.g., 512, FIG. 11) or a different subset of bits (e.g., 516, FIG. 11) of the bit-word stream using an additional FEC code; and wherein the constellation mapper is further configured (e.g., by way of 1140, FIG. 11) to use the additional parity data stream to select signs applied to a subset of the constellation-symbol amplitudes.

In some embodiments of any of the above apparatus, the digital signal processor further comprises: an additional shaping encoder (e.g., 510$_2$, FIG. 13) configured to generate an additional bit-word stream (e.g., 512$_2$, FIG. 13) by encoding the input data stream in using an additional shaping code; and an additional constellation mapper (e.g., 550$_2$, FIG. 13) configured to: generate a second constellation-symbol stream (e.g., 552$_2$, FIG. 13); use the additional bit-word stream to select constellation-symbol amplitudes for the second constellation-symbol stream; and use a portion of the parity data stream (e.g., supplied by 1346$_2$, FIG. 13) to select signs applied to at least some of the constellation-symbol amplitudes when generating the second constellation-symbol stream.

In some embodiments of any of the above apparatus, the FEC encoder (e.g., 520, FIG. 13) is further configured (e.g., by way of 1340, FIG. 13) to generate the parity data stream (e.g., 522, FIG. 13) by encoding a subset of bits (e.g., 518$_2$, FIG. 13) of the additional bit-word stream using the FEC code.

In some embodiments of any of the above apparatus, the parity data stream is used to select signs applied to at least some of the constellation-symbol amplitudes of at least one of the first constellation-symbol stream and the second constellation-symbol stream.

In some embodiments of any of the above apparatus, the constellation mapper and the additional constellation mapper are configured to use respective constellations having different respective sizes (e.g., m$_1$≠m$_2$, FIG. 13).

In some embodiments of any of the above apparatus, the shaping encoder (e.g., 510$_1$, FIG. 13) is configured to generate the bit-word stream (e.g., 512$_1$, FIG. 13) by encoding a first portion (e.g., 506$_1$, FIG. 13) of the input data stream; and wherein the additional shaping encoder is configured to generate the additional bit-word stream by encoding a second portion (e.g., 506$_2$, FIG. 13) of the input data stream, the second portion being different from the first portion.

According to another example embodiment disclosed above, e.g., in the summary section and/or in reference to any one or any combination of some or all of FIGS. 1-14, provided is an apparatus (e.g., 110 or 150, FIG. 1) comprising a data receiver (e.g., 300, FIG. 3) that comprises an electrical analog front end (e.g., 310, FIG. 3) and a digital signal processor (e.g., 324, FIG. 3), the digital signal processor being configured to process a first stream of values (e.g., one of 332, FIG. 3; 902, FIG. 9) representing a modulated carrier of a received electrical signal outputted by the electrical analogue front end, the first stream of values representing a first constellation-symbol stream (e.g., 552, FIG. 5; 852, FIG. 8; one of 212, FIG. 2), the digital signal processor being configured to redundancy-decode the first stream of values to recover a source data stream redundancy-encoded in the first constellation-symbol stream and carried by the modulated electrical carrier; and wherein the digital signal processor comprises: an FEC decoder (e.g., 930, FIG. 9) configured to generate a first bit stream (e.g., 542, FIG. 9) and a first bit-word stream (e.g., 518, FIG. 9) by redundancy-decoding the first stream of values, the first bit stream carrying sign bits of the first constellation-symbol stream, the first bit-word stream carrying a first subset of bits of binary values encoded in constellation-symbol amplitudes of the first constellation-symbol stream, the redundancy-decoding being performed using an FEC code; a constellation demapper (e.g., 950, FIG. 9) configured to generate a second bit-word stream (e.g., 518, FIG. 9) by matching each of the first stream of values with a corresponding constellation point, the matching being performed using the first bit stream and the first bit-word stream, the second bit-word stream carrying a second subset of bits of the binary values encoded in the constellation-symbol amplitudes of the first constellation-symbol stream; and a shaping decoder (e.g., 970, FIG. 9) configured to recover the source data stream by decoding a third bit-word stream (e.g., 512, FIG. 9) generated by combining bit-words of the first and second bit-word streams, the decoding being performed using a shaping code.

In some embodiments of the above apparatus, the shaping code is configured to cause constellation-symbol amplitudes to approximately follow a predefined probability distribution in which at least some amplitudes have different respective probabilities of occurrence.

In some embodiments of any of the above apparatus, the first subset of bits includes a fixed number (e.g., (c−1), FIG. 5) of LSBs from each of the binary values encoded in the constellation-symbol amplitudes of the first constellation-symbol stream; and wherein the second subset of bits includes a fixed number (e.g., (m−c), FIG. 5) of MSBs from each of the binary values encoded in the constellation-symbol amplitudes of the first constellation-symbol stream.

In some embodiments of any of the above apparatus, the FEC code is an LDPC code.

In some embodiments of any of the above apparatus, the digital signal processor is further configured to process a plurality of streams of values (e.g., 332$_1$-332$_K$, FIG. 3) representing the received electrical signal outputted by the electrical analogue front end in response to receiving an electrical input signal (e.g., 302, FIG. 3) having a plurality of modulated electrical carriers, each of the streams of values representing a respective one of a plurality of constellation-symbol streams (e.g., 212$_1$-212$_K$, FIG. 2), the digital signal processor being configured to redundancy-decode the streams of values to recover corresponding source data streams redundancy-encoded in the plurality of constellation-symbol streams and carried by the plurality of modulated electrical carriers.

In some embodiments of any of the above apparatus, the apparatus further comprises a modem (e.g., 150, FIG. 1), the modem including the data receiver.

In some embodiments of any of the above apparatus, the apparatus further comprises a service distribution unit (e.g., 110, FIG. 1), the service distribution unit including the data receiver.

In some embodiments of any of the above apparatus, the digital signal processor further comprises an additional FEC decoder (e.g., 1230, FIG. 12) configured to use a portion (e.g., 1142', FIG. 12) of the first bit stream (e.g., 542, FIG. 12) to correct one or more errors in the third bit-word stream prior to application of the third bit-word stream to the shaping decoder, the additional FEC decoder being configured to use a different additional FEC code.

In some embodiments of any of the above apparatus, the digital signal processor further comprises an additional shaping decoder (e.g., $970_2$, FIG. 14) connected to receive data from the FEC decoder (e.g., 1430, FIG. 14), the additional shaping decoder being configured to decode the data received from the FEC decoder using an additional shaping code.

While this disclosure includes references to illustrative embodiments, this specification is not intended to be construed in a limiting sense.

For example, although example embodiments have been described above in reference to LDPC codes, other suitable FEC codes can similarly be used instead of or in addition to LDPC codes.

Although example embodiments have been described above in reference to FDM, some embodiments are compatible with single-carrier modulation formats.

Although example embodiments have been described above in reference to a DMT system, some embodiments are compatible with other communication systems, such as those configured to transmit data for other purposes and/or applications.

Various modifications of the described embodiments, as well as other embodiments within the scope of the disclosure, which are apparent to persons skilled in the art to which the disclosure pertains are deemed to lie within the principle and scope of the disclosure, e.g., as expressed in the following claims.

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Unless explicitly stated otherwise, each numerical value and range should be interpreted as being approximate as if the word "about" or "approximately" preceded the value or range. Also, unless explicitly stated otherwise, each named distribution or function type should be interpreted as being an example as if the words "such as" preceded the distribution or function name.

It will be further understood that various changes in the details, materials, and arrangements of the parts which have been described and illustrated in order to explain the nature of this disclosure may be made by those skilled in the art without departing from the scope of the disclosure, e.g., as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The description and drawings merely illustrate the principles of the disclosure. It will thus be appreciated that those of ordinary skill in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

The functions of the various elements shown in the figures, including any functional blocks labeled as "processors" and/or "controllers," may be provided through the use of dedicated hardware as well as hardware capable of executing software in association with appropriate software. Some circuit elements may be implemented using, without limitation, digital signal processor (DSP) hardware, an application specific integrated circuit (ASIC), a field programmable gate array (FPGA), a read only memory (ROM) for storing software, a random access memory (RAM), and non-volatile storage. Other hardware, conventional and/or custom, may also be included.

It should be appreciated by those of ordinary skill in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

What is claimed is:

1. An apparatus comprising a data transmitter that comprises an electrical analog front end and a digital signal processor, the digital signal processor being configured to:
    redundancy-encode an input data stream to generate a first constellation-symbol stream; and
    drive the analog front end to cause a modulated electrical carrier generated by the analog front end to carry the first constellation-symbol stream; and wherein the digital signal processor comprises:
   a shaping encoder configured to generate a bit-word stream by encoding the input data stream using a shaping code;
   an FEC encoder configured to generate a parity data stream by encoding a subset of bits of the bit-word stream using an FEC code; and
   a constellation mapper configured to:
      use the bit-word stream to select constellation-symbol amplitudes for the first constellation-symbol stream; and
      use the parity data stream to select signs applied to at least some of the constellation-symbol amplitudes.

2. The apparatus of claim 1, wherein the shaping code is configured to cause constellation-symbol amplitudes to approximately follow a predefined probability distribution in which at least some amplitudes have different respective probabilities of occurrence.

3. The apparatus of claim 1, wherein the FEC encoder is configured to generate the parity data stream by encoding the subset of bits of the bit-word stream together with a subset of bits of the input data stream.

4. The apparatus of claim 3, wherein the constellation mapper is configured to:
   use the parity data stream to select signs applied to a first subset of the constellation-symbol amplitudes; and
   use the subset of bits of the input data stream to select signs applied to a second subset of the constellation-symbol amplitudes.

5. The apparatus of claim 3,
   wherein the digital signal processor further comprises a demultiplexer configured to demultiplex the input data stream into a first sub-stream and a second sub-stream;
   wherein the first sub-stream is applied to the shaping encoder for being encoded therein using the shaping code;
   wherein a first copy of the second sub-stream is applied to the FEC encoder for being encoded therein together with the subset of bits of the bit-word stream using the FEC code; and
   wherein a second copy of the second sub-stream is applied to the constellation mapper for being used therein to select signs applied to a subset of the constellation-symbol amplitudes.

6. The apparatus of claim 1, wherein the subset of bits of the bit-word stream includes a fixed number of LSBs from each bit-word.

7. The apparatus of claim 1, wherein the FEC code is an LDPC code.

8. The apparatus of claim 1, wherein the constellation mapper comprises:
   a first Gray mapper configured to generate a second constellation-symbol stream by mapping a fixed number of MSBs from each bit-word of the bit-word stream onto a first constellation;
   a second Gray mapper configured to generate a third constellation-symbol stream by mapping a fixed number of LSBs from each bit-word of the bit-word stream onto a second constellation; and
   a constellation-symbol combiner configured to generate the first constellation-symbol stream by combining constellation symbols of the second and third constellation-symbol streams, said combining being performed using a stream of sign bits, said stream of sign bits including the parity data stream.

9. The apparatus of claim 1,
   wherein the digital signal processor is further configured to:
      redundancy-encode the input data stream to generate a plurality of constellation-symbol streams, said plurality of constellation-symbol streams including the first constellation-symbol stream; and
      drive the analog front end to generate an electrical output signal having plurality of modulated electrical carriers, each of the modulated electrical carriers carrying a respective different one of the constellation-symbol streams; and
      use the parity data stream to select signs applied to at least some constellation-symbol amplitudes of the plurality of constellation-symbol streams.

10. The apparatus of claim 9, further comprising a modem, the modem including the data transmitter.

11. The apparatus of claim 9, further comprising a service distribution unit, the service distribution unit including the data transmitter.

12. The apparatus of claim 1,
   wherein the digital signal processor further comprises an additional FEC encoder configured to generate an additional parity data stream by encoding the bit-word stream or a different subset of bits of the bit-word stream using an additional FEC code; and
   wherein the constellation mapper is further configured to use the additional parity data stream to select signs applied to a subset of the constellation-symbol amplitudes.

13. The apparatus of claim 1, wherein the digital signal processor further comprises:
   an additional shaping encoder configured to generate an additional bit-word stream by encoding the input data stream in using an additional shaping code; and
   an additional constellation mapper configured to:
      generate a second constellation-symbol stream; and
      use the additional bit-word stream to select constellation-symbol amplitudes for the second constellation-symbol stream;
   wherein the FEC encoder is further configured to generate the parity data stream by encoding a subset of bits of the additional bit-word stream using the FEC code; and
   wherein the parity data stream is used to select signs applied to at least some of the constellation-symbol amplitudes of at least one of the first constellation-symbol stream and the second constellation-symbol stream.

14. The apparatus of claim 13, wherein the constellation mapper and the additional constellation mapper are configured to use respective constellations having different respective sizes.

15. The apparatus of claim 13,
   wherein the shaping encoder is configured to generate the bit-word stream by encoding a first portion of the input data stream; and
   wherein the additional shaping encoder is configured to generate the additional bit-word stream by encoding a second portion of the input data stream, the second portion being different from the first portion.

16. An apparatus comprising a data receiver that comprises an electrical analog front end and a digital signal processor, the digital signal processor being configured to process a first stream of values representing a modulated carrier of a received electrical signal outputted by the electrical analogue front end, the first stream of values representing a first constellation-symbol stream, the digital signal processor being configured to redundancy-decode the first stream of values to recover a source data stream redundancy-encoded in the first constellation-symbol stream and carried by the modulated electrical carrier; and wherein the digital signal processor comprises:

an FEC decoder configured to generate a first bit stream and a first bit-word stream by redundancy-decoding the first stream of values, the first bit stream carrying sign bits of the first constellation-symbol stream, the first bit-word stream carrying a first subset of bits of binary values encoded in constellation-symbol amplitudes of the first constellation-symbol stream, the redundancy-decoding being performed using an FEC code;

a constellation demapper configured to generate a second bit-word stream by matching each of the first stream of values with a corresponding constellation point, the matching being performed using the first bit stream and the first bit-word stream, the second bit-word stream carrying a second subset of bits of the binary values encoded in the constellation-symbol amplitudes of the first constellation-symbol stream; and a shaping decoder configured to recover the source data stream by decoding a third bit-word stream generated by combining bit-words of the first and second bit-word streams, the decoding being performed using a shaping code.

17. The apparatus of claim 16, wherein the shaping code is configured to cause constellation-symbol amplitudes to approximately follow a predefined probability distribution in which at least some amplitudes have different respective probabilities of occurrence.

18. The apparatus of claim 16, wherein the first subset of bits includes a fixed number of LSBs from each of the binary values encoded in the constellation-symbol amplitudes of the first constellation-symbol stream; and wherein the second subset of bits includes a fixed number of MSBs from each of the binary values encoded in the constellation-symbol amplitudes of the first constellation-symbol stream.

19. The apparatus of claim 16, wherein the FEC code is an LDPC code.

20. The apparatus of claim 16, wherein the digital signal processor is further configured to process a plurality of streams of values representing the received electrical signal outputted by the electrical analogue front end in response to receiving an electrical input signal having a plurality of modulated electrical carriers, each of the streams of values representing a respective one of a plurality of constellation-symbol streams, the digital signal processor being configured to redundancy-decode the streams of values to recover corresponding source data streams redundancy-encoded in the plurality of constellation-symbol streams and carried by the plurality of modulated electrical carriers.

21. The apparatus of claim 20, further comprising a modem, the modem including the data receiver.

22. The apparatus of claim 20, further comprising a service distribution unit, the service distribution unit including the data receiver.

23. The apparatus of claim 16, wherein the digital signal processor further comprises an additional FEC decoder configured to use a portion of the first bit stream to correct one or more errors in the third bit-word stream prior to application of the third bit-word stream to the shaping decoder, the additional FEC decoder being configured to use a different additional FEC code.

24. The apparatus of claim 16, wherein the digital signal processor further comprises an additional shaping decoder connected to receive data from the FEC decoder, the additional shaping decoder being configured to decode the data received from the FEC decoder using an additional shaping code.

* * * * *